(12) United States Patent
Booth, Jr. et al.

(10) Patent No.: US 7,879,660 B2
(45) Date of Patent: Feb. 1, 2011

(54) SEMICONDUCTOR STRUCTURES INTEGRATING DAMASCENE-BODY FINFET'S AND PLANAR DEVICES ON A COMMON SUBSTRATE AND METHODS FOR FORMING SUCH SEMICONDUCTOR STRUCTURES

(75) Inventors: Roger Allen Booth, Jr., Rochester, MN (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 11/927,780

(22) Filed: Oct. 30, 2007

(65) Prior Publication Data

US 2008/0050866 A1 Feb. 28, 2008

Related U.S. Application Data

(62) Division of application No. 11/211,956, filed on Aug. 25, 2005, now Pat. No. 7,352,034.

(51) Int. Cl.
*H01L 21/00* (2006.01)
*H01L 21/84* (2006.01)
(52) U.S. Cl. .............................. 438/157; 257/E21.633
(58) Field of Classification Search ................ 438/157; 257/E21.633
See application file for complete search history.

(56) References Cited

U.S. PATENT DOCUMENTS

| | | | |
|---|---|---|---|
| 3,855,009 A | 12/1974 | Lloyd et al. | |
| H000948 H | 8/1991 | Aklufi | |
| 5,279,978 A * | 1/1994 | See et al. | 438/154 |
| 5,293,053 A * | 3/1994 | Malhi et al. | 257/330 |
| 6,645,797 B1 | 11/2003 | Buynoski et al. | |
| 6,835,618 B1 | 12/2004 | Dakshina-Murthy et al. | |
| 6,853,020 B1 | 2/2005 | Yu et al. | |
| 6,855,583 B1 | 2/2005 | Krivokapic et al. | |
| 6,858,478 B2 | 2/2005 | Chau et al. | |

(Continued)

FOREIGN PATENT DOCUMENTS

CN 1645577 A1 7/2005

(Continued)

*Primary Examiner*—David A Zarneke
*Assistant Examiner*—Igwe U Anya
(74) *Attorney, Agent, or Firm*—Wood, Herron & Evans, LLP

(57) ABSTRACT

Methods of forming a semiconductor structure having Fin-FET's and planar devices, such as MOSFET's, on a common substrate by a damascene approach, and semiconductor structures formed by the methods. A semiconductor fin of the FinFET is formed on a substrate with damascene processing in which the fin growth may be interrupted to implant ions that are subsequently transformed into a region that electrically isolates the fin from the substrate. The isolation region is self-aligned with the fin because the mask used to form the damascene-body fin also serves as an implantation mask for the implanted ions. The fin may be supported by the patterned layer during processing that forms the FinFET and, more specifically, the gate of the FinFET. The electrical isolation surrounding the FinFET may also be supplied by a self-aligned process that recesses the substrate about the FinFET and at least partially fills the recess with a dielectric material.

14 Claims, 20 Drawing Sheets

U.S. PATENT DOCUMENTS

| | | | |
|---|---|---|---|
| 6,864,164 B1 | 3/2005 | Dakshina-Murthy et al. | |
| 6,911,383 B2 | 6/2005 | Doris et al. | |
| 7,029,958 B2 | 4/2006 | Tabery et al. | |
| 7,091,566 B2 | 8/2006 | Zhu et al. | |
| 2003/0151077 A1 | 8/2003 | Mathew et al. | |
| 2005/0239242 A1* | 10/2005 | Zhu et al. | 438/199 |
| 2005/0280121 A1* | 12/2005 | Doris et al. | 257/629 |
| 2006/0017137 A1* | 1/2006 | Iwamatsu | 257/627 |
| 2006/0024931 A1* | 2/2006 | Chan et al. | 438/528 |
| 2006/0084235 A1* | 4/2006 | Barr et al. | 438/300 |
| 2006/0208300 A1* | 9/2006 | Iwanaga et al. | 257/308 |
| 2006/0214226 A1* | 9/2006 | Chen et al. | 257/347 |
| 2006/0286779 A1* | 12/2006 | Booth et al. | 438/480 |

FOREIGN PATENT DOCUMENTS

| | | |
|---|---|---|
| WO | 2004084292 A1 | 9/2004 |

* cited by examiner

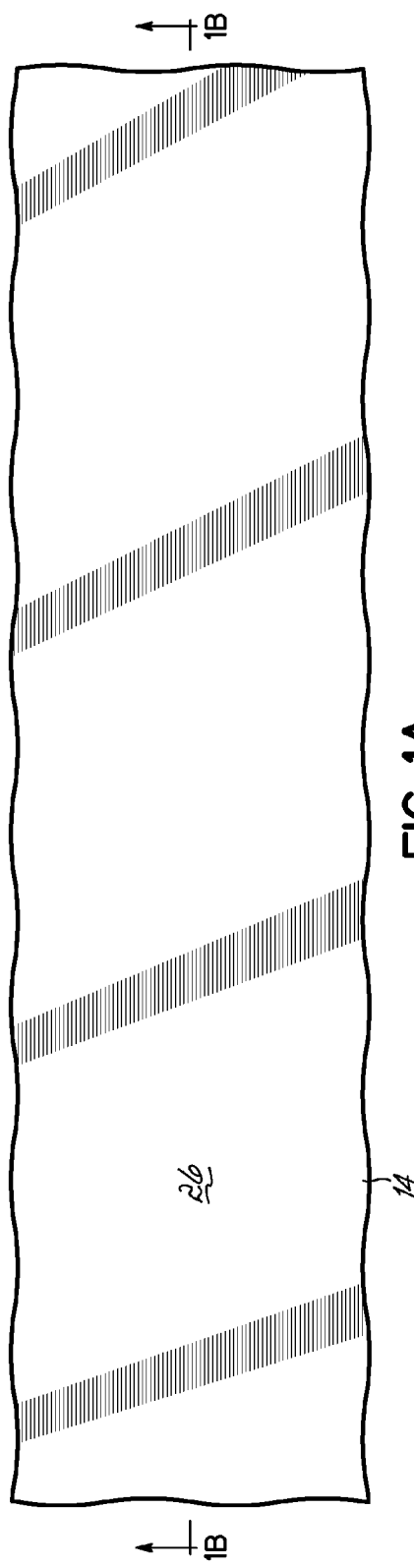
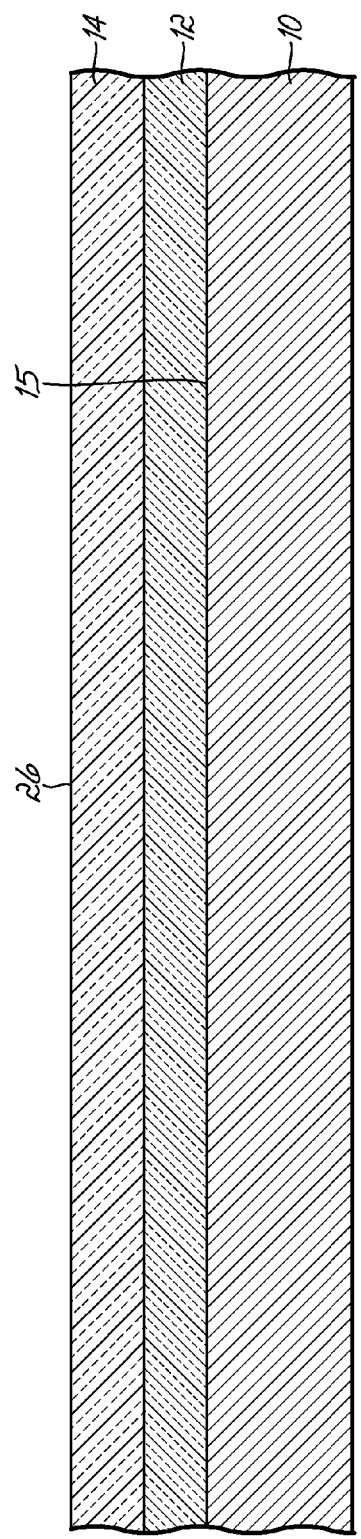
FIG. 1A
FIG. 1B

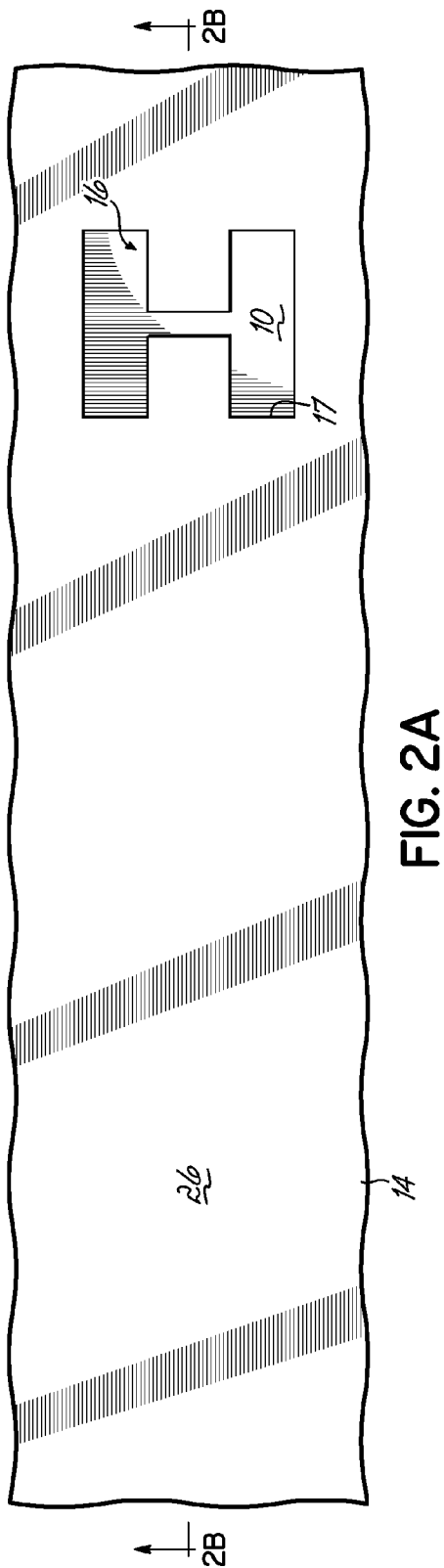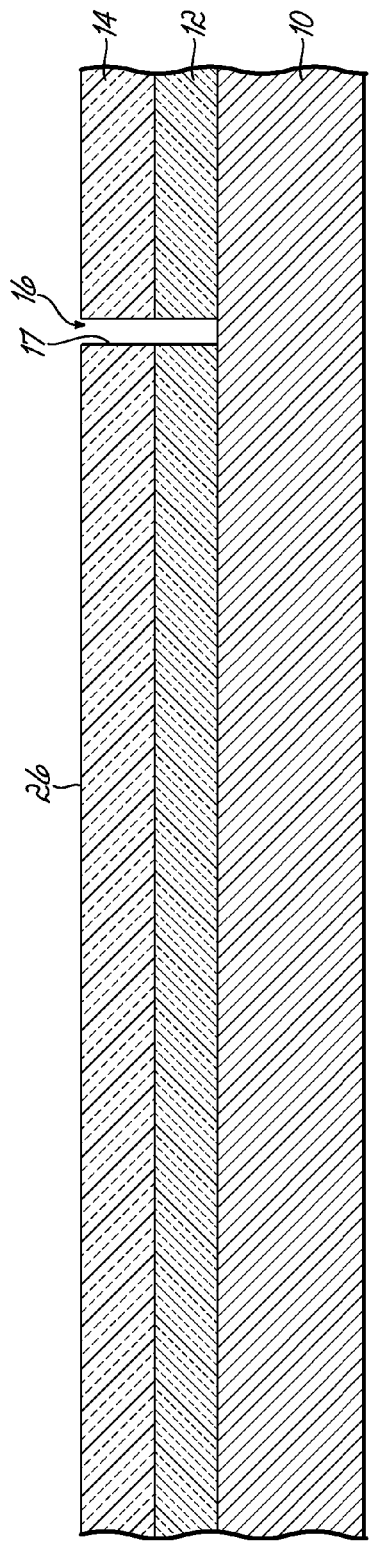
FIG. 2A
FIG. 2B

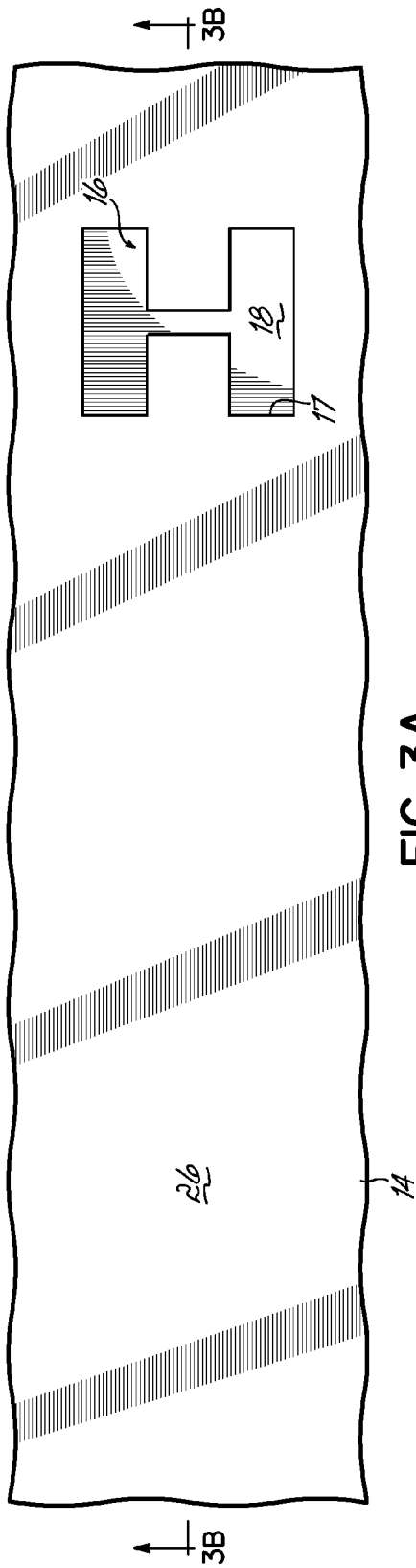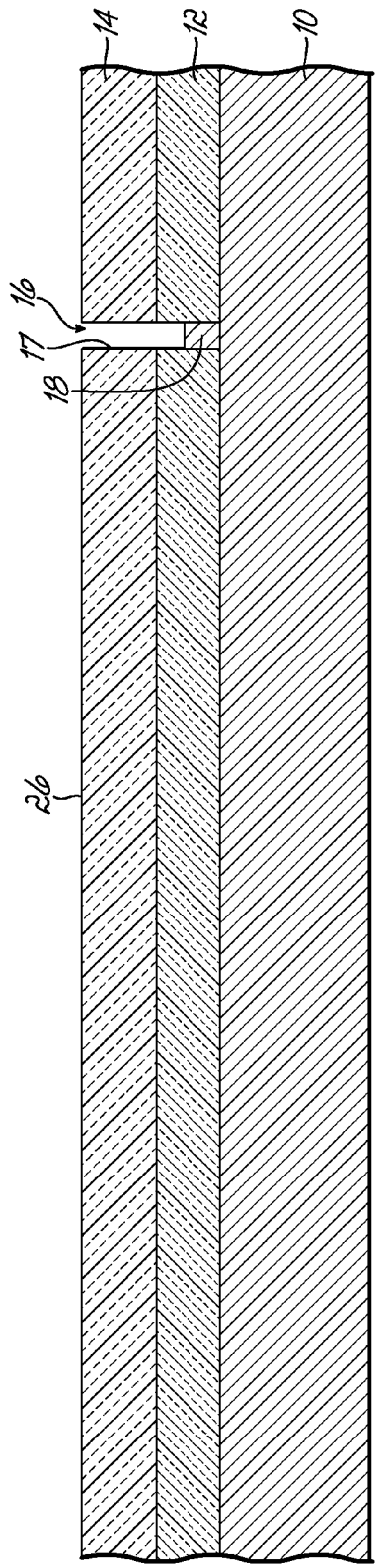
FIG. 3A
FIG. 3B

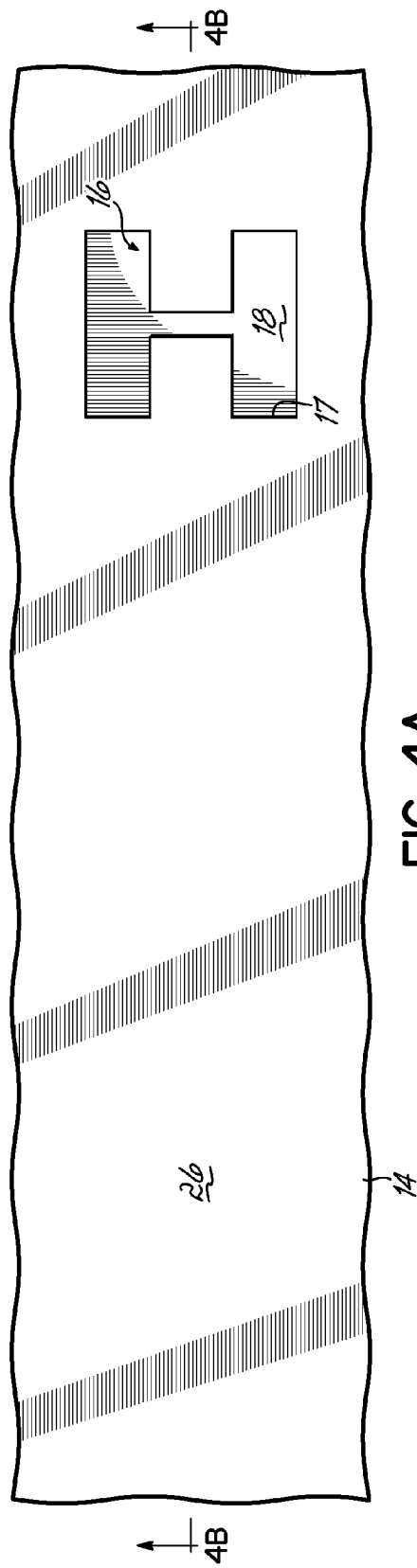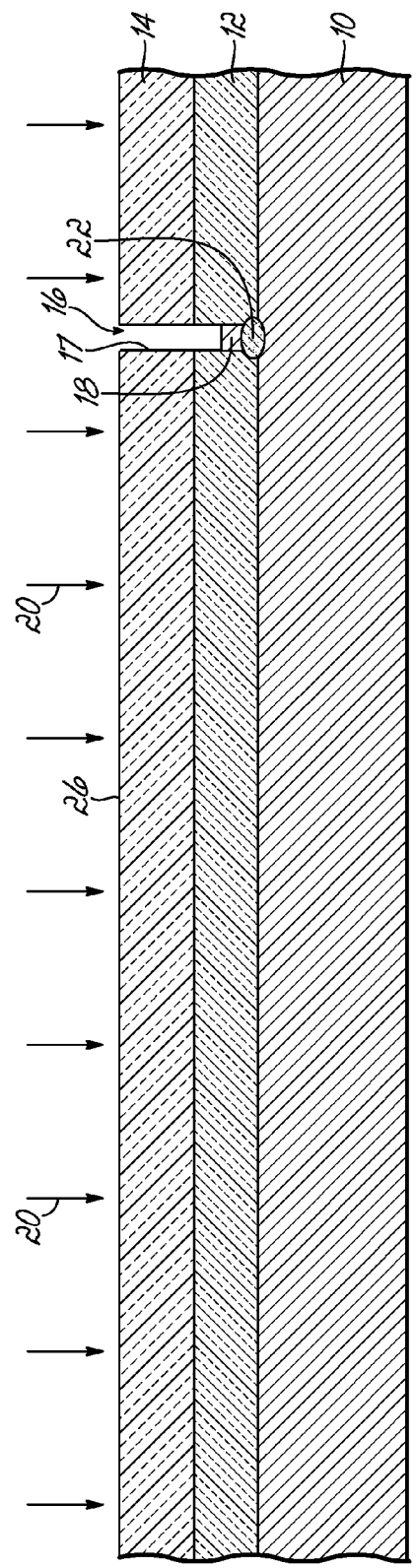
FIG. 4A
FIG. 4B

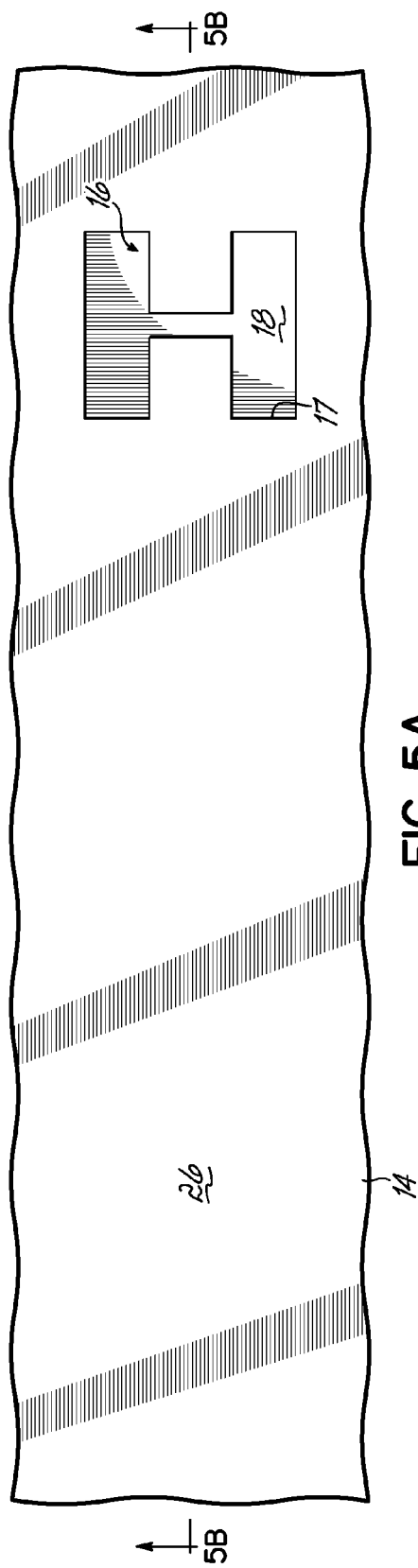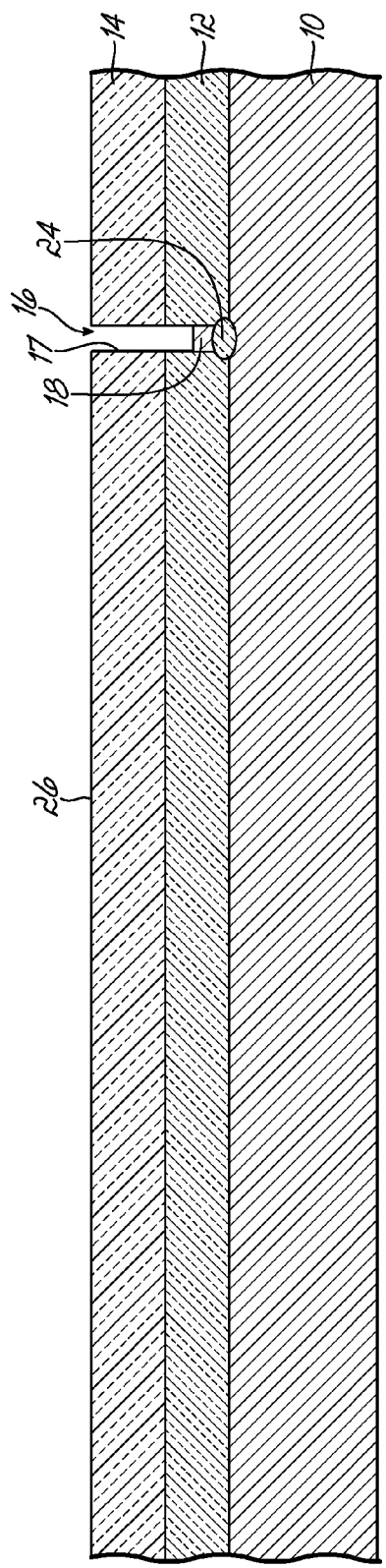
FIG. 5A
FIG. 5B

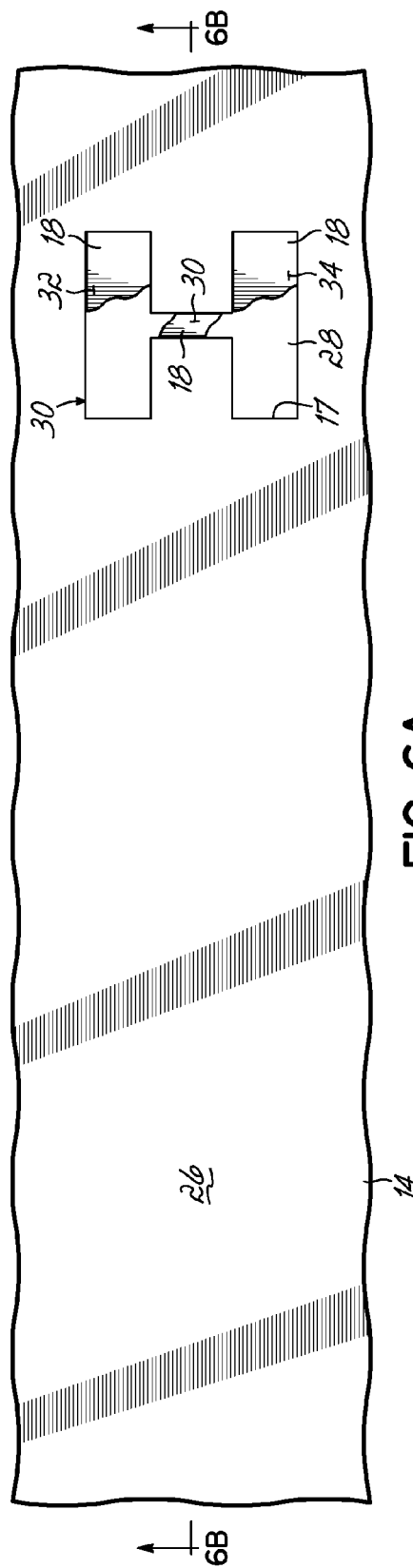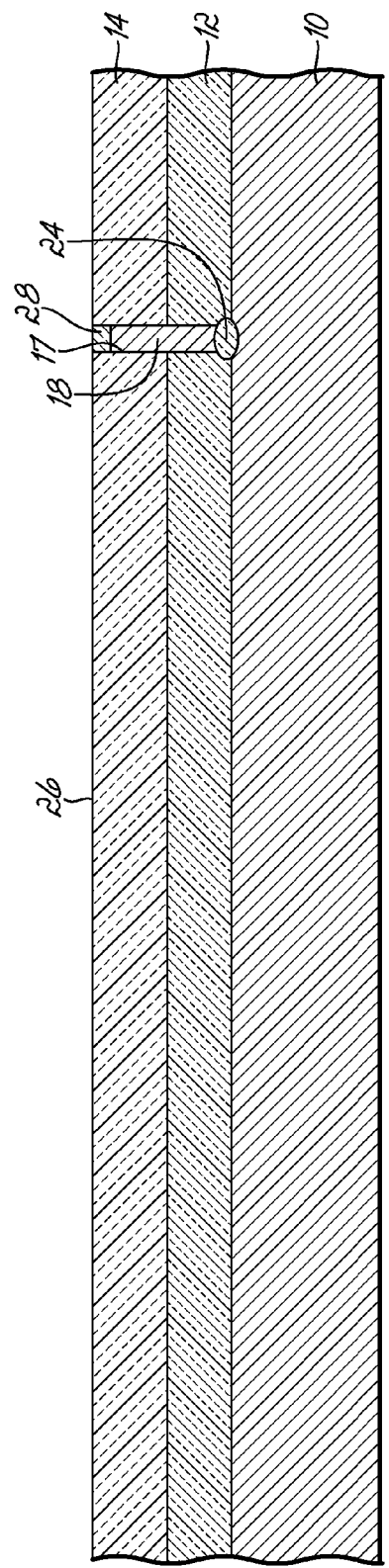
FIG. 6A
FIG. 6B

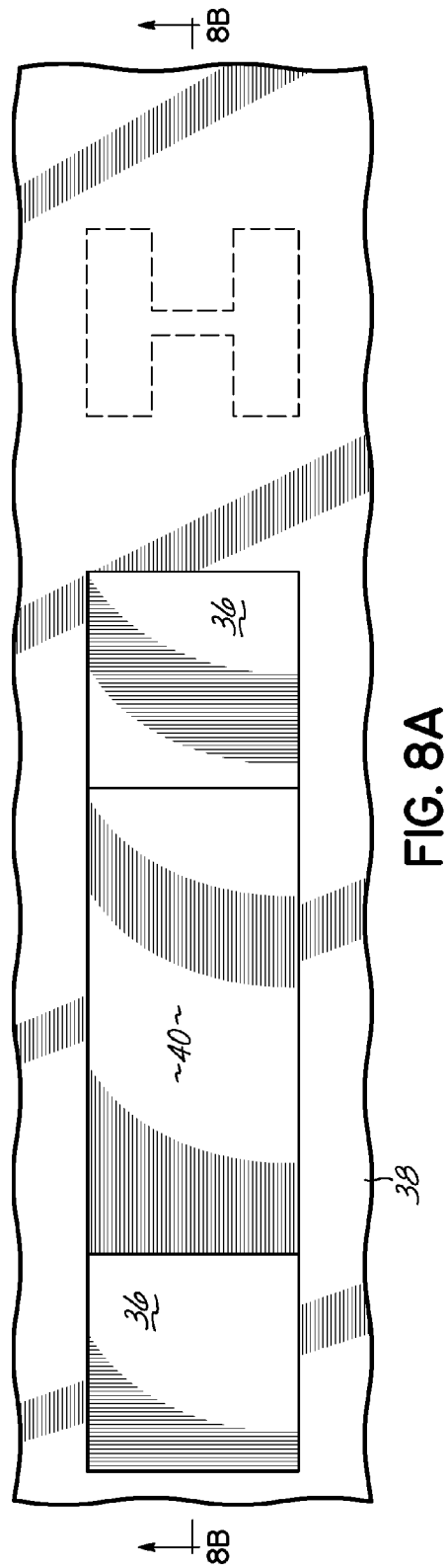
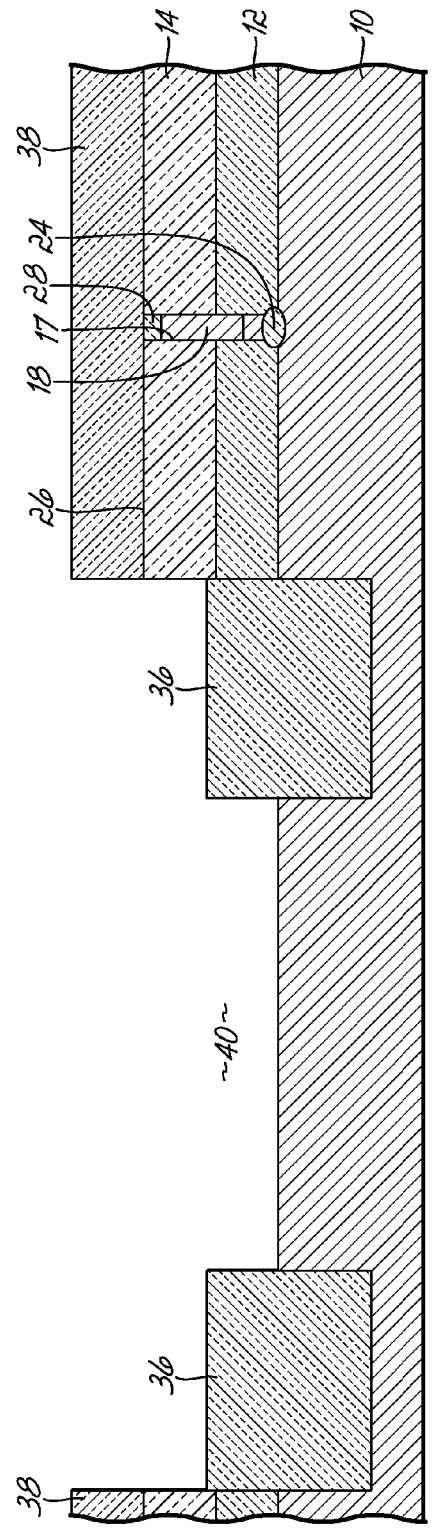
FIG. 8A
FIG. 8B

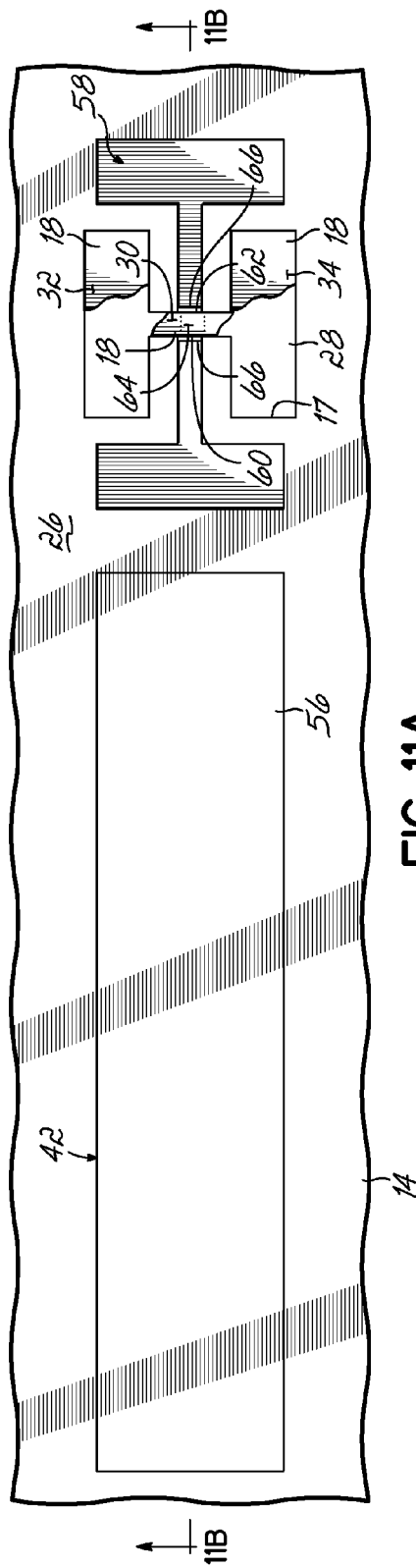
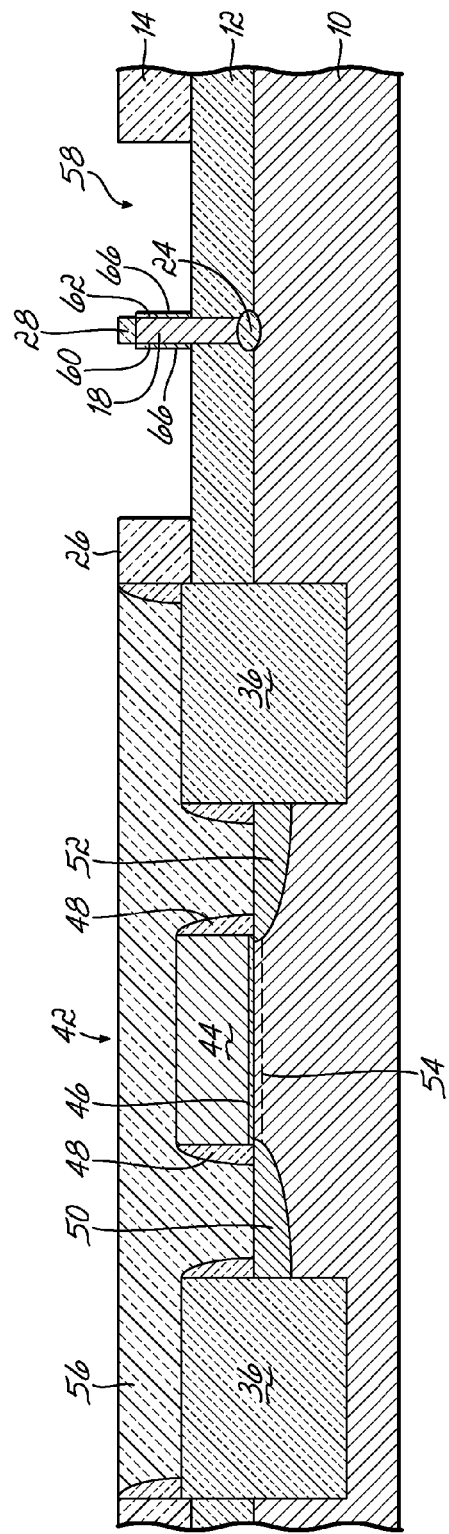
FIG. 11A
FIG. 11B

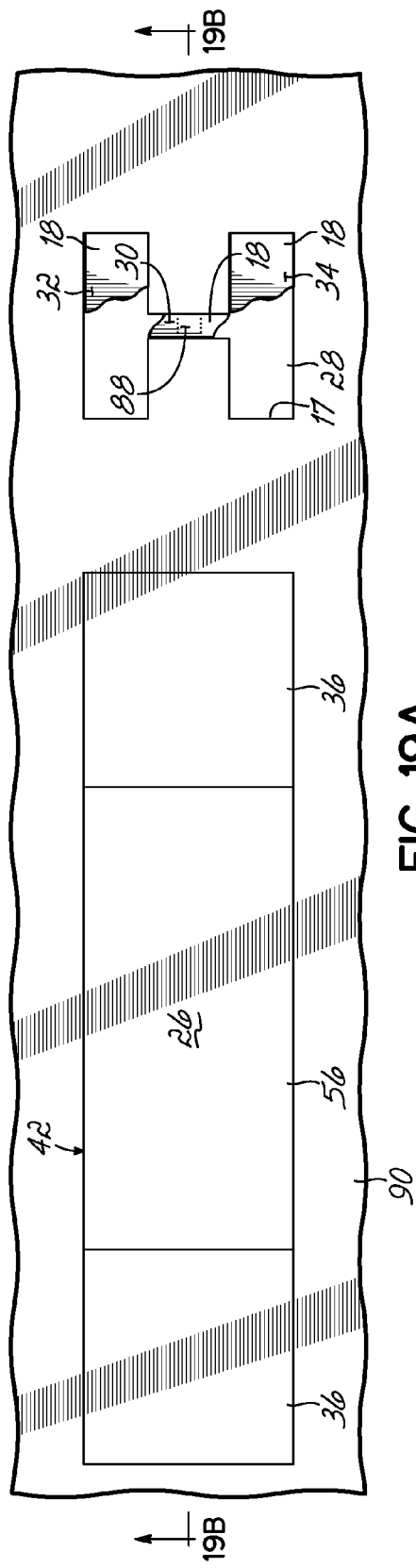
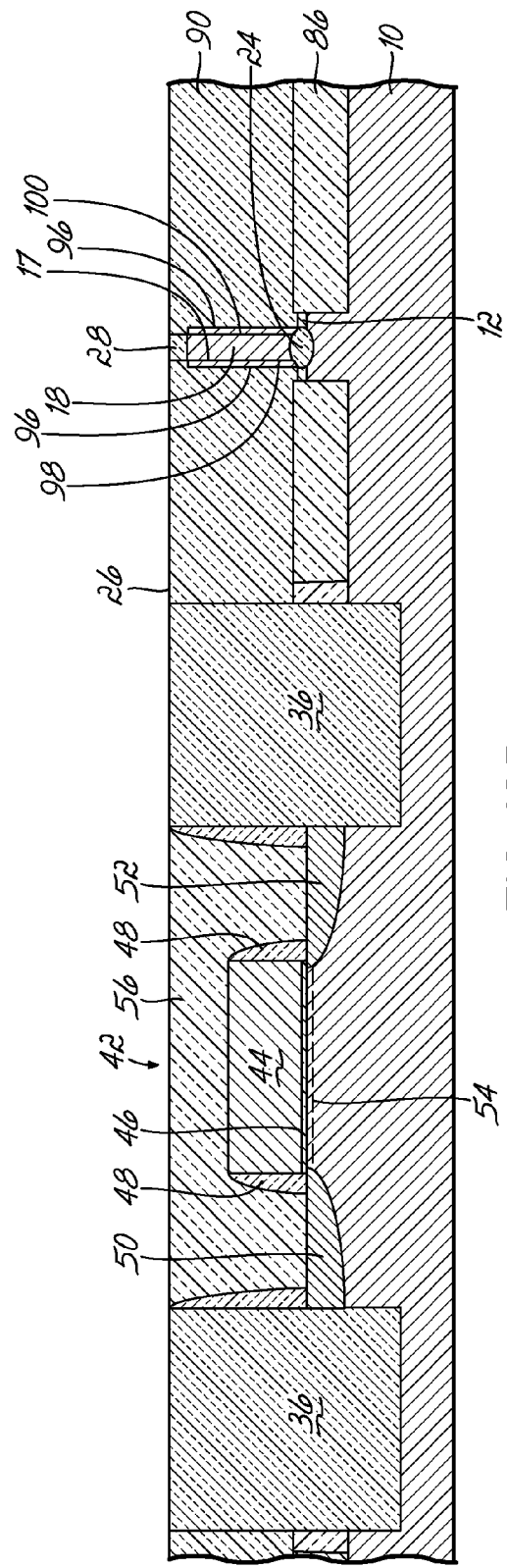
FIG. 19A
FIG. 19B

SEMICONDUCTOR STRUCTURES INTEGRATING DAMASCENE-BODY FINFET'S AND PLANAR DEVICES ON A COMMON SUBSTRATE AND METHODS FOR FORMING SUCH SEMICONDUCTOR STRUCTURES

CROSS-REFERENCE TO RELATED APPLICATIONS

This application is a divisional of application Ser. No. 11/211,956, filed Aug. 25, 2005, which is hereby incorporated by reference herein in its entirety.

FIELD OF THE INVENTION

The invention relates generally to semiconductor structures and, in particular, to semiconductor structures integrating damascene-body FinFET's and planar CMOS FET's on a common substrate and methods of forming such semiconductor structures.

BACKGROUND OF THE INVENTION

Progressive miniaturization of feature sizes in circuit elements has improved the performance and increased the functional capability of integrated circuits. Fin-type field effect transistors (FinFETs) are low-power, high speed transistors that can be densely packed on a substrate. Unfortunately, FinFET's are not suitable for all purposes in integrated circuit design. Different applications require different transistor device behaviors. During operation, FinFET's are fully depleted, which is desirable for many applications. However, the circuit design may also require conventional devices, like metal-oxide semiconductor field effect transistors (MOSFET's), that do not reach full depletion.

Generally, a conventional FinFET structure includes a central vertical semiconductor fin or body that includes a central channel region, source and a drain at opposite ends of the vertical fin that are separated by the central channel region, and a gate conductor covering the channel region. Typically, the semiconductor fin has a width that is less than the minimum lithographic dimension and a relatively high aspect ratio.

In conventional FinFET structures, the semiconductor fin is freestanding and unsupported by surrounding structural elements during processing. Consequently, the fragile and unsupported semiconductor fin has a significant risk of breakage during process steps that involve, for example, ultrasonic agitation. The fragile and unsupported semiconductor fin may also be broken by thermal effects caused by drastic temperature changes that are experienced during certain process steps forming the FinFET.

Silicon-on-insulator substrates are known that include both FinFET's and planar MOSFET's in which the semiconductor fin of the FinFET is formed through a trench using the crystalline silicon of the semiconductor-on-insulator (SOI) substrate as a seed layer. However, because of isolation issues, these conventional fabrication techniques are exclusively applicable to SOI substrates in which the crystalline silicon of the SOI layer is electrically isolated from the underlying portions of the substrate by a buried insulator layer. Consequently, these conventional fabrication techniques are not applicable to integrating FinFET's and planar devices, such as MOSFET's, on a common bulk substrate.

What is needed, therefore, is a bulk substrate including both damascene-body FinFET's and planar MOSFET's, and manufacturing methods for forming damascene-body FinFET's and planar MOSFET's on a common bulk, or on an SOI substrate, that overcome these and other disadvantages of conventional substrates and conventional methods of manufacturing such substrates.

SUMMARY OF THE INVENTION

Embodiments of the present invention are generally directed to integrating damascene-body FinFET's and planar CMOS FET's on a common substrate. In accordance with one aspect of the present invention, a semiconductor structure comprises a monocrystalline bulk substrate, a plurality of planar devices built into the monocrystalline bulk substrate, and a plurality of fin-type field effect transistors. Each fin-type field effect transistor is electrically isolated from the monocrystalline bulk substrate and also from the planar devices.

In another aspect of the present invention, a method of making a semiconductor structure comprises etching a trench in a mask and forming a semiconductor fin in the trench. The method further includes supporting the semiconductor fin with the mask while forming a gate structure intersecting a channel region of the semiconductor fin.

In yet another aspect of the present invention, a method of making a semiconductor structure comprises etching a trench in a mask covering a substrate, forming a first epitaxial layer in the trench, and implanting ions into the first epitaxial layer through the mask such that the trench self-aligns the implanted ions with the first epitaxial layer. The method further includes transforming the implanted ions into a buried isolation region electrically isolating the first epitaxial layer from the substrate and then forming a second epitaxial layer in the trench and on the first epitaxial layer.

In yet another aspect of the present invention, a method of making a semiconductor structure comprises forming a semiconductor fin projecting from a substrate and etching portions of the substrate surrounding the semiconductor fin to define a recess in the substrate about a base of the semiconductor fin. The method further includes at least partially filling the recess with a dielectric material to electrically isolate the semiconductor fin from the substrate.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

FIGS. 1-14 are diagrammatic views of a portion of a substrate at various fabrication stages of a processing method in accordance with an embodiment of the invention wherein A represents a top view and B is a corresponding cross-sectional view taken generally along lines B-B in A; and FIGS. 15-20 are diagrammatic cross-sectional views of a portion of a substrate at various fabrication stages of a processing method in accordance with another alternative embodiment of the invention wherein A represents a top view and B is a corresponding cross-sectional view taken generally along lines B-B in A.

DETAILED DESCRIPTION

Figure 7A:
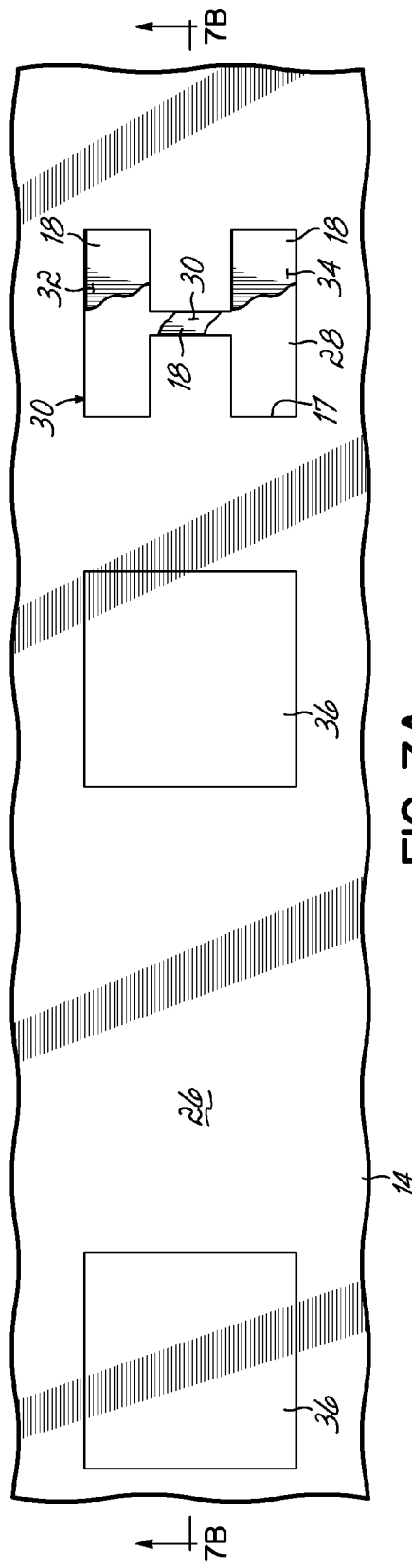
Figure 7B:
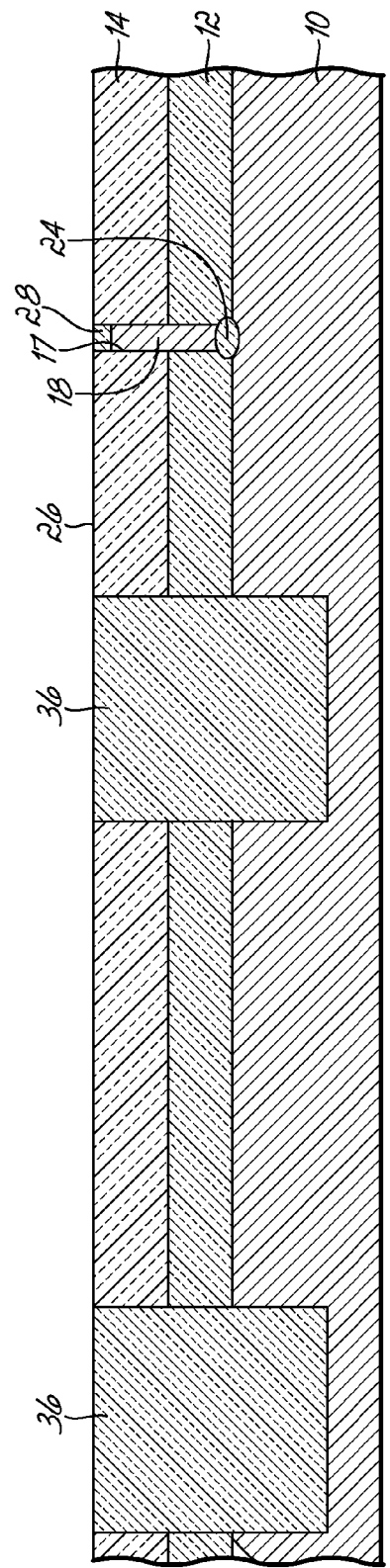

The present invention, which provides embodiments of a semiconductor structure integrating fin-type field effect transistors (FinFET's) and planar complementary metal oxide semiconductor (CMOS) devices, such as field effect transistors (FET's), on a common bulk substrate or on a silicon-on-insulator (SOI) substrate and methods for fabricating these semiconductor structures, will now be described in greater detail by referring to the drawings that accompany the present application.

FIGS. 1-14 illustrate the fabrication stages employed in one embodiment of the present invention. In these drawings, the views labeled with "A" are top views of the semiconductor structure at one of the fabrication stages, while the views labeled with "B" are cross-sectional views of the semiconductor structure.

With reference to FIGS. 1A,B, a monocrystalline substrate 10 is provided or obtained in accordance with an initial fabrication stage in accordance with one embodiment of the present invention. Substrate 10 may be any type of conventional monocrystalline semiconductor substrate, such as the illustrated bulk silicon substrate or, for example, the active layer of a semiconductor-on-insulator (SOI) substrate. A relatively thick pad oxide layer 12 of an oxide ($SiO_x$) is formed on an exposed surface 15 of substrate 10. The pad oxide layer 12 may be either deposited by a conventional thermal chemical vapor deposition (CVD) process or grown by a conventional wet or dry thermal oxidation process. The pad oxide layer 12 will subsequently partially create the isolation for the semiconductor fin 30 (FIGS. 6A,B) and will also reduce parasitic gate capacitance. Preferably, the vertical thickness of the pad oxide layer 12 is about 50 nanometers (nm) to about 200 nm.

A pad nitride layer 14 is formed on the pad oxide layer 12. The pad nitride layer 14 is composed of silicon nitride ($Si_3N_4$) formed utilizing a conventional deposition process such as CVD or plasma-assisted CVD. The hardness and wear resistance of pad nitride layer 14 is sufficient to function as a hardmask and as a polish stop layer during the subsequent fabrication stages. The material forming pad nitride layer 14 must also etch selectively to the pad oxide layer 12. The vertical thickness of the pad nitride layer 14, which will determine the fin height, is preferably about 50 nm to about 500 nm.

With reference to FIGS. 2A,B in which like reference numerals refer to like features in FIGS. 1A,B and at a subsequent fabrication stage, patterned openings or trenches 16 are formed in the pad oxide layer 12 and the pad nitride layer 14 by a conventional lithography and etching method. The trenches 16 extend vertically from a substantially planar surface 26, defined at this fabrication stage as the upper horizontal surface of pad nitride layer 14, to the depth of the substrate 10. It should be noted that although the drawings illustrate the formation of a single trench 16, the present invention contemplates the formation of a plurality of such trenches 16 in the semiconductor structure. Each of the trenches 16 ultimately defines the fin 30 (FIGS. 6A,B) and source and drain regions 32, 34 (FIGS. 6A,B) of one FinFET 72 (FIGS. 14A,B) at a later fabrication stage.

Figure 14A:
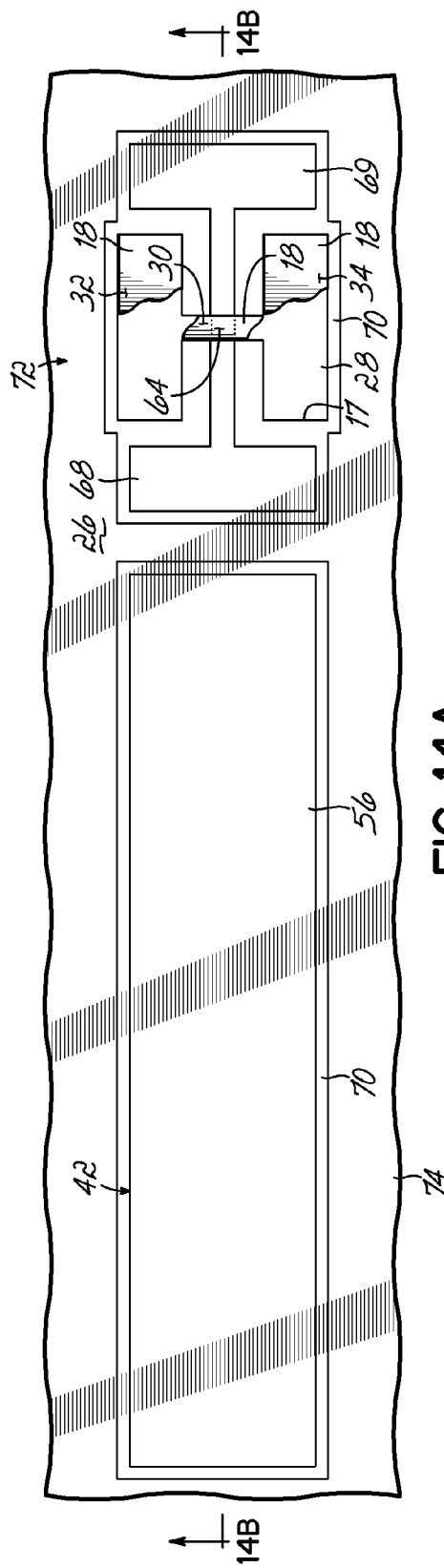
Figure 14B:
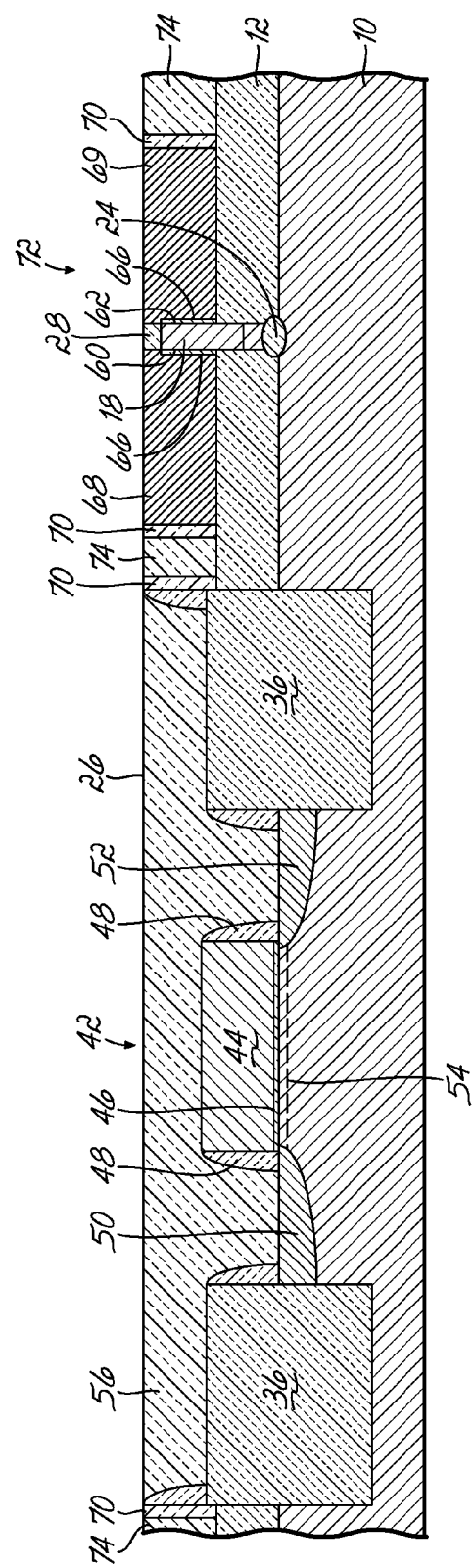

The pattern of the trenches 16, which are each typically H-shaped, may be formed by any conventional lithography technique that applies a resist (not shown) across the surface of pad nitride layer 14, exposes the resist to a pattern of radiation, and develops the transferred pattern in the exposed photoresist. Suitable lithography techniques include photolithography with or without phase shift, x-ray lithography, electron beam lithography, or a combination of a sidewall image transfer technique to form a portion of the trench 16 for the fin 30, and conventional lithography to form another portion of the trench 16 for defining the source-drain regions 32, 34 of the FinFET 72 (FIGS. 14A,B).

A conventional anisotropic dry etching process selective to the material constituting the pad oxide layer 12, such as reactive-ion etching (RIE) or plasma etching, is used to transfer the trench pattern into the pad nitride layer 14 to the depth of the pad oxide layer 12. The chemistry of the etching process, which may be conducted in a single etching step or multiple steps, removes portions of the pad nitride layer 14 visible through the trench pattern and stops vertically on the pad oxide layer 12. The trench pattern is extended to the depth of the substrate 10 by another conventional anisotropic dry etching process, such as RIE or plasma etching, selective to the material constituting the substrate 10. The chemistry of the etching process, which may be conducted in a single etching step or multiple steps, removes portions of the pad oxide layer 12 visible through the patterned pad nitride layer 14 and stops vertically on the substrate 10.

With reference to FIGS. 3A,B in which like reference numerals refer to like features in FIGS. 2A,B and at a subsequent fabrication stage, an epitaxial layer 18 of a suitable semiconductor material, like silicon, is selectively formed within each of the trenches 16. The epitaxial layer 18 does not completely fill each trench 16 but instead extends vertically to only partially fill each trench 16. Preferably, the vertical height of the epitaxial layer 18 is between about 25 nm and about 100 nm. The exposed surface of the substrate 10 at the base of each trench 16 operates as a seed for crystal growth and determines the crystal orientation of the epitaxial layer 18 by supplying a template for the growth of the material of the epitaxial layer 18 in which this template is reproduced. The semiconductor material forming the epitaxial layer 18 preferably does not form with an appreciable thickness on the vertical surfaces of the pad oxide layer 12 and the pad nitride layer 14 surrounding each trench 16 above the vertical height of epitaxial layer 18. Growth of the epitaxial layer 18 is later resumed at a subsequent fabrication stage after providing for electrical isolation between the substrate 10 and the epitaxial layer 18, as described below.

One process suitable for forming the epitaxial layer 18 is a selective epitaxial growth (SEG) process performed at sub-atmospheric process pressures and with a substrate temperature between about 850° C. and about 1050° C. Typical process conditions are about 40 torr and about 900° C. Preferred silicon sources for the SEG process include, but are not limited to, silicon tetrachloride ($SiCl_4$), trichlorosilane ($SiHCl_3$), and dichlorosilane ($SiH_2Cl_2$). The presence of chlorine in the silicon source enhances the selectivity for limiting growth on regions of the pad oxide layer 12 and the pad nitride layer 14 surrounding each trench 16 and above the vertical height of epitaxial layer 18. The selective growth preserves the crystal structure of the material in epitaxial layer 18 without introducing significant lattice defects that would be detrimental to the operation of the FinFET 72 (FIGS. 14A,B).

With reference to FIGS. 4A,B in which like reference numerals refer to like features in FIGS. 3A,B and at a subsequent fabrication stage, the epitaxial layer 18 is ion implanted at approximately normal incidence with oxygen-containing ions 20, such as atomic or molecular oxygen ions. The implantation energy of the ions results in a relatively shallow depth for the resulting oxygen concentration profile 22, which is distributed vertically about an ion range. The resulting peak concentration of the oxygen concentration profile 22 is located approximately at the interface between the substrate 10 and the epitaxial layer 18 and overlaps with the pad oxide layer 12. For example, an $O^+$ species of ions 20 may be implanted at an energy within the range of about 25 keV to about 100 keV and at an ion dose ranging from about $2\times10^{17}$ $cm^{-2}$ to about $5\times10^{18}$ $cm^{-2}$. At a later fabrication stage, the oxygen concentration profile 22 is transformed into a buried isolation region 24 (FIGS. 5A,B) positioned under the fin 30 and isolating the semiconductor fin 30 (FIGS. 6A,B) from the substrate 10. The present invention contemplates that other ion species, either in addition to oxygen or instead of oxygen, may be implanted to provide the requisite electrical isolation for the semiconductor fin 30.

Implanting the oxygen-containing ions 20 through the trenches 16 in the pad oxide layer 12 and pad nitride layer 14 self-aligns the buried isolation region 24 relative to the fin 30. A sidewall 17 of each opened trench 16, which operates to mask the substrate 10, substantially defines the lateral extent of the isolation region 24. Although the ions 20 impinge the epitaxial layer 18 with approximately normal incidence, lateral straggle of the energetic ions 20 causes the concentration profile 22 to extend laterally of the vertically-projected sidewall 17 into the substrate 10 and into the pad oxide layer 12 and, thus, in a direction normal to the ion incident direction.

Advantageously, implanting the oxygen-containing ions 20 at a low implant energy through the relatively thin epitaxial layer 18, after pausing the formation of layer 18, limits the vertical ion straggle of the oxygen concentration profile 22 in epitaxial layer 18. If the epitaxial layer 18 completely fills each trench 16, a significantly higher implant energy is required which would increase the lattice damage incurred by the epitaxial layer 18 and make it more difficult to control the resulting depth of the oxygen concentration profile 22 because of the increased vertical ion straggle. The portion of the epitaxial layer 18 above the oxygen concentration profile 22 is substantially damage-free after the implantation of ions 20 and, consequently, can function as a seed layer in a subsequent process step to continue the epitaxial growth of layer 18, as described below.

With reference to FIGS. 5A,B in which like reference numerals refer to like features in FIGS. 4A,B and at a subsequent fabrication stage, the epitaxial layer 18 is heat treated or annealed in a suitable atmosphere, such as an inert gas atmosphere or vacuum, to remove ion-induced damage to the epitaxial layer 18 resulting from the implantation of ions 20. The anneal, which may be performed at a substrate temperature between about 1100° C. and about 1300° C., also completely forms the buried isolation region 24 by causing the oxygen-rich material defined by the concentration profile 22 in the epitaxial layer 18 and substrate 10 to coalesce and define isolation region 24.

With reference to FIGS. 6A,B in which like reference numerals refer to like features in FIGS. 5A,B and at a subsequent fabrication stage, selective formation of the epitaxial layer 18 is resumed, following the anneal. The resumed formation may use, for example, SEG to deposit an additional thickness of the material constituting epitaxial layer 18. The initially-formed portion of the epitaxial layer 18 operates as a seed for the resumed formation so that the initial crystallinity is perpetuated into the newly-added material by supplying a template for the growth of the newly-added material in which this template is reproduced. Epitaxial layer 18 is formed to a vertical height projecting above the top horizontal surface of the pad nitride layer 14. An upper horizontal surface of the epitaxial layer 18 is then made substantially coplanar with the upper horizontal surface of pad nitride layer 14 by a planarization process, such as a chemical mechanical polishing (CMP) process, to re-establish the substantially planar surface 26 and complete the damascene process. Such conventional CMP planarization processes combine abrasion and dissolution to remove the overburden of excess material of epitaxial layer 18 residing on pad nitride layer 14 and stops vertically on the pad nitride layer 14.

The planarized epitaxial layer 18 is recessed relative to the planar surface 26 to a depth of about 10 nm to about 100 nm by, for example, an anisotropic dry etch process. A blanket layer of an insulator, such as a CVD oxide, is then formed on the planar surface 26. The substantial planarity of planar surface 26 is re-established by a planarization process, such as a CMP planarization process, that removes the excess overburden of the blanket insulator layer and stops at the vertical level of the upper horizontal surface of pad nitride layer 14. A residual portion of the insulator layer fills the space above each recessed portion of the epitaxial layer 18 and, thus, defines a protective insulating cap 28 over the material forming the epitaxial layer 18.

The epitaxial layer 18 in each of the trenches 16 defines the thin central semiconductor body or fin 30 and the source and drain regions 32, 34, which are considered to include the enlarged contacts at opposite ends of the fin 30. The fin 30 projects vertically from the interface with the substrate 10 and is supported laterally by the material of the pad oxide layer 12 and the material constituting the pad nitride layer 14.

With reference to FIGS. 7A,B in which like reference numerals refer to like features in FIGS. 6A,B and at a subsequent fabrication stage, shallow trench isolation (STI) regions 36 are formed at various locations across the substrate 10 by a conventional lithography and etching method that involves masking the planar surface 26 and etching, such as with an RIE or plasma etch, trenches (shown as filled in FIGS. 7A,B) through the pad oxide layer 12 and the pad nitride layer 14 and continuing a shallow depth into the substrate 10. An optional liner (not shown) may be applied to the trenches after etching into the substrate 10. A blanket layer of an insulator suitable for forming the STI regions 36 is deposited, such as a CVD oxide like TEOS or an HDP oxide, portions of which fill the trenches. The substantial planarity of the planar surface 26 is reestablished by a conventional planarization process, such as a chemical mechanical polishing (CMP) process, that removes the excess overburden of the blanket insulator layer and stops on the upper horizontal surface of pad nitride layer 14.

With reference to FIGS. 8A,B in which like reference numerals refer to like features in FIGS. 7A,B and at a subsequent fabrication stage, a block mask 38 is applied to the planar surface 26 to cover and protect the epitaxial layer 18 and portions of hardmask layer surrounding the epitaxial layer 18. Successive anisotropic dry etch processes are used to remove portions of the pad oxide layer 12 and the pad nitride layer 14 unprotected by the block mask 38 to define recessed regions 40 open to the substrate 10 for the subsequent fabrication of planar devices. A first anisotropic dry etch process removes the material of pad nitride layer 14 selective to the material of pad oxide layer 12. A second anisotropic dry etch process removes the material of pad oxide layer 12 selective to the material of pad nitride layer 14. The block mask 38 is not required to overlap the STI regions 36, but must cover the regions destined for the subsequent formation of FinFET's 72 (FIGS. 14A,B) to avoid etching the insulating cap 28. After the recessed regions 40 are defined, the block mask 38 is stripped to expose the planar surface 26, whose planarity is now interrupted by the presence of the recessed regions 40.

Figure 9A:
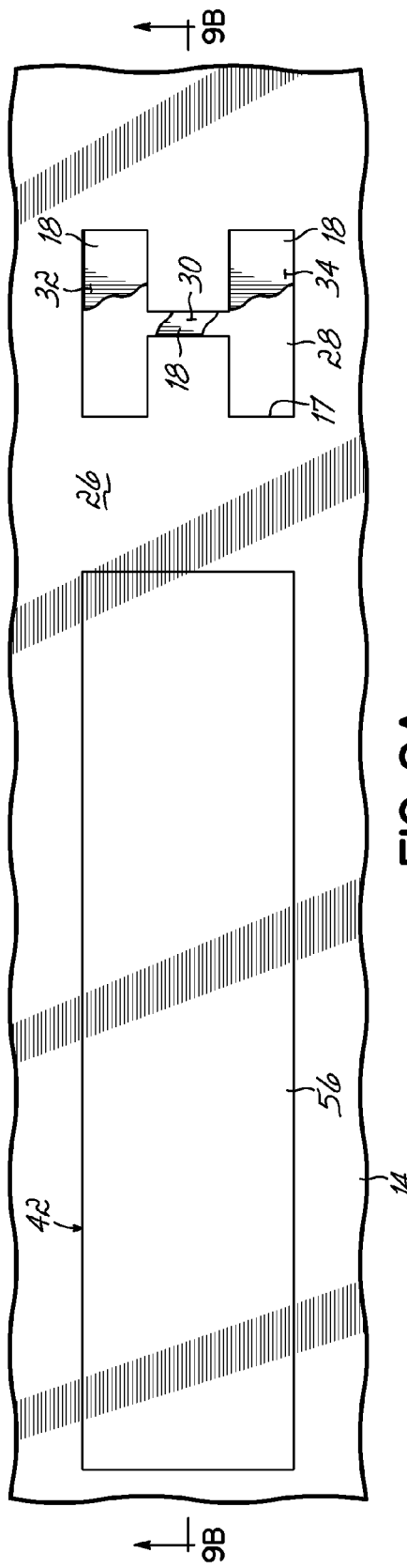
Figure 9B:
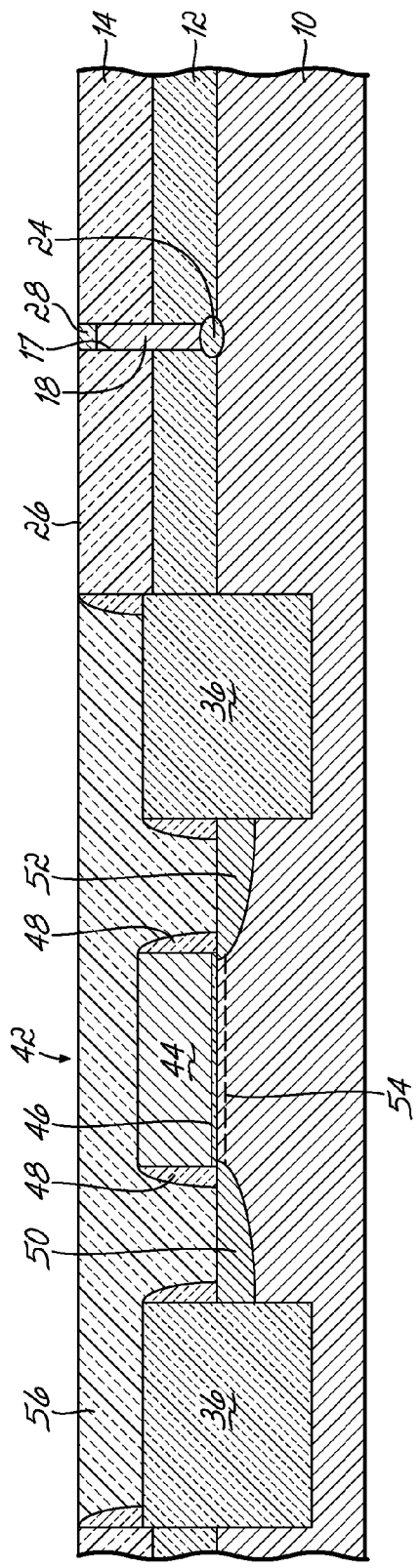

With reference to FIGS. 9A,B in which like reference numerals refer to like features in FIGS. 8A,B and at a subsequent fabrication stage, a planar semiconductor device, which is generally indicated by reference numeral 42 and which is illustrated for purposes of discussion as a metal-oxide-semiconductor field effect transistor (MOSFET), is formed in each of the recessed regions 40 by a succession of conventional processing steps understood by a person of ordinary skill in the art. Device 42 includes a gate electrode 44 that is separated from the substrate 10 by a thin gate dielectric 46. Gate electrode 44 may be polycrystalline silicon ("polysilicon") doped to be highly conductive or may be formed from one or more metals, such as molybdenum, titanium, tantalum or nickel, a metal silicide, or a metal nitride. The gate dielectric 46 may comprise an oxide (i.e., $SiO_2$) grown from either a dry oxygen ambient or steam, or another material such as $Si_3N_4$, oxynitride ($SiO_xN_y$), a gate dielectric stack of $SiO_2$ and $Si_3N_4$, or a metal oxide like $Ta_2O_5$.

Sidewall spacers 48 are formed on the sidewall of the gate electrode 44, and other exposed vertical surfaces, from a material such as $Si_3N_4$. The gate electrode 44 and/or sidewall spacers 48 may act as a self-aligned mask for one or more ion implantations that form a source region 50 and a drain region 52. Techniques for implanting a dopant to form source and drain regions 50, 52 is familiar to persons of ordinary skill in the art. Alternatively, the source and drain regions 50, 52 may be formed by dopant diffusion or a combination of dopant diffusion and ion implantation. A portion of substrate 10 situated between the source and drain regions 50, 52 comprises a channel 54 having a resistivity controlled by voltage supplied from a power supply to the gate electrode 44, which is electrostatically coupled with the channel 54 through the gate dielectric 46. Finally, a layer 56 of an insulator, which is preferably a soft reflowable and easily planarizable oxide like borophosphosilicate glass (BPSG), borosilicate glass (BSG), phosphosilicate glass (PSG), or undensified tetraethylorthosilicate (TEOS), is deposited to fill the remaining open space of each recessed region 40. The insulator layer 56 is planarized by a conventional planarization process, such as CMP, to re-establish the substantial planarity of the planar surface 26 to the horizontal surface of the pad nitride layer 14.

Figure 10A:
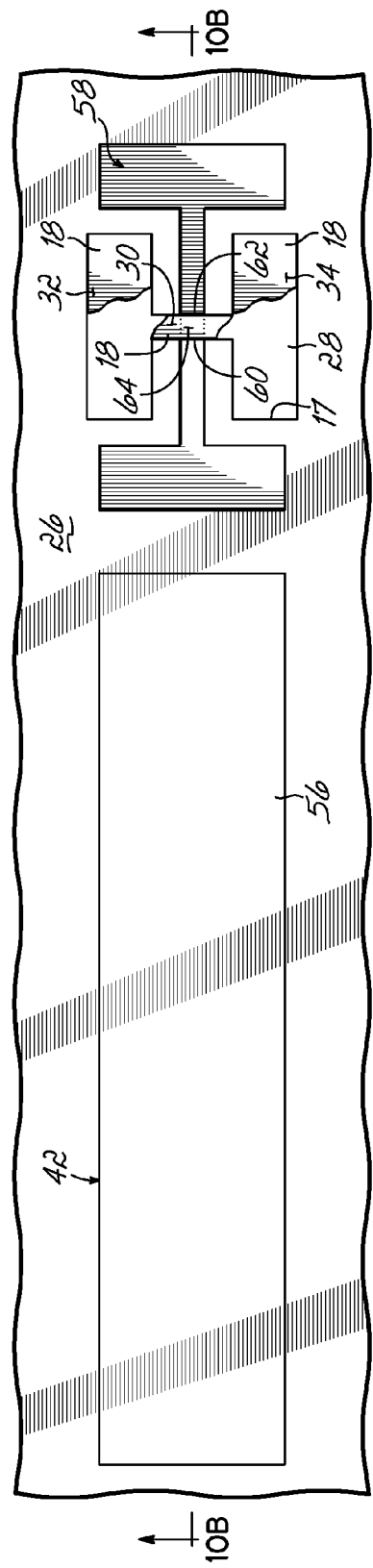
Figure 10B:
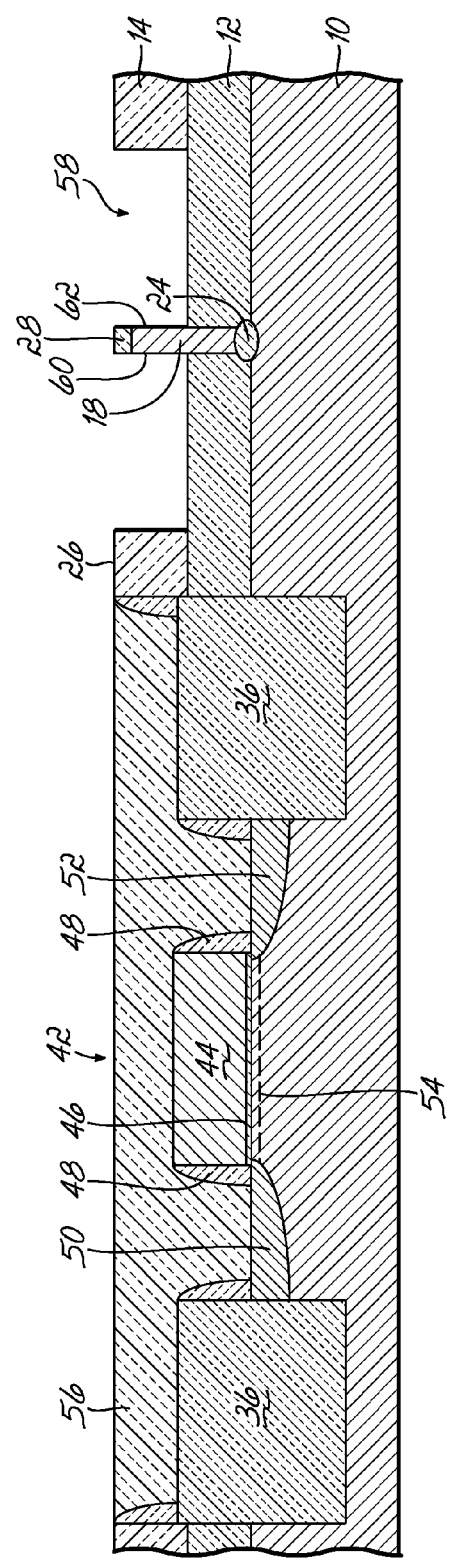

With reference to FIGS. 10A,B in which like reference numerals refer to like features in FIGS. 9A,B and at a subsequent fabrication stage, gate trenches 58 are formed in the pad nitride layer 14 by a conventional lithography and etching process in which areas of pad nitride layer 14 exposed through patterned openings in a removable protective mask (not shown) are removed by, for example, RIE or plasma etching selective to the material of the oxide layer 12. Each gate trench 58 extends to the vertical level of the oxide layer 12. The gate trenches 58 are subsequently filled by portions of a conductor to provide a set of gates 68, 69 for each FinFET 72 (FIGS. 14A,B). Opposite vertical sidewalls 60, 62 of the semiconductor fin 30 are exposed across a channel region 64 of the constituent semiconductor material of epitaxial layer 18. The source and drain regions 32, 34 remain covered and protected by the pad nitride layer 14. Other than the portion of the length of fin 30 exposed along vertical sidewalls 60, 62, the remainder of the semiconductor fin 30 is remains supported by the pad oxide layer 12 and pad nitride layer 14.

Channel region 64 may be optionally doped by, for example, a gas phase dopant diffusion process or an angled ion implantation. The optional channel doping of the channel region 64 typically would entail the use of multiple masks (not shown), such as photoresist masks, to introduce different dopants in various levels to form N-channel FinFET's and P-channel FinFET's of various threshold voltages. If the thickness of the fin 30 in the channel region 64 is sufficiently narrow, channel doping may be omitted as the intrinsic semiconductor material in channel region 64 is fully-depleted during operation of the FinFET 72 (FIGS. 14A,B).

With reference to FIGS. 11A,B in which like reference numerals refer to like features in FIGS. 10A,B and at a subsequent fabrication stage, a gate dielectric 66 is formed on the exposed opposite sidewalls 60, 62 of the channel region 64 of each semiconductor fin 30. The gate dielectric 66 may consist of any conventional gate insulator material including, but not limited to, silicon oxides ($SiO_x$), silicon oxynitride ($SiO_xN_y$), silicon nitride ($Si_3N_4$), high dielectric constant (high-K) dielectrics such as silicon-hafnium-oxynitride, or combinations thereof, as recognized by persons of ordinary skill in the art. The thickness of the gate dielectric 66 is preferably in a range from about 1 nm to about 6 nm.

Figure 12A:
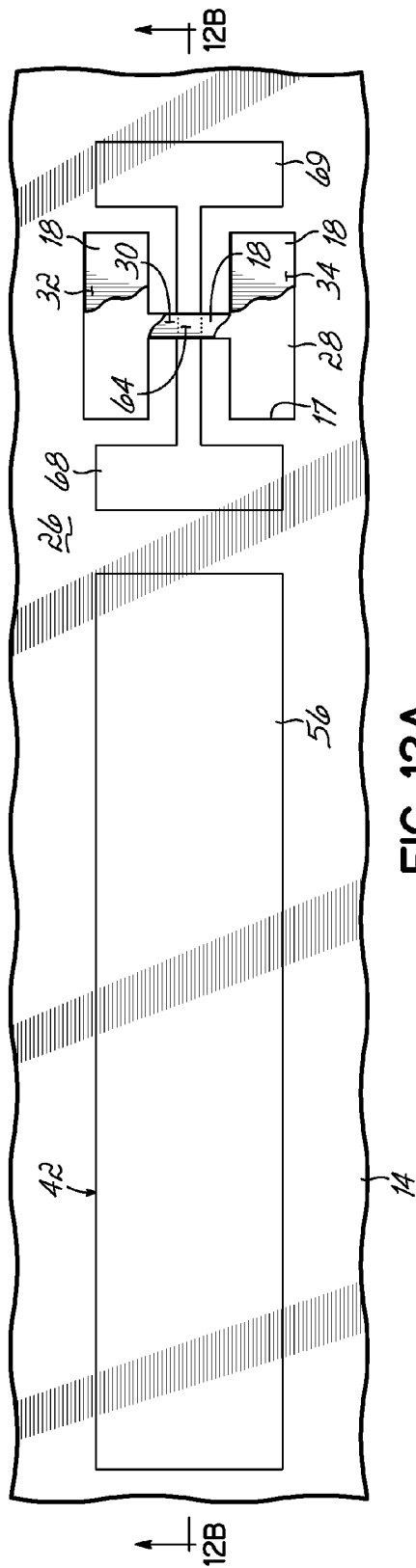
Figure 12B:
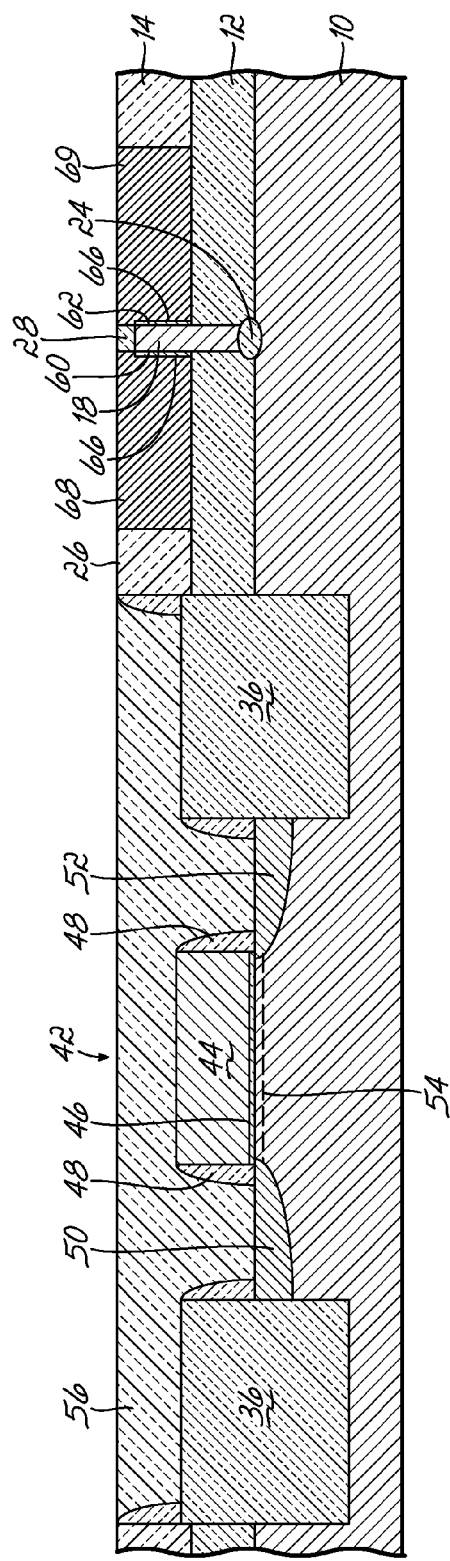

With reference to FIGS. 12A,B in which like reference numerals refer to like features in FIGS. 11A,B and at a subsequent fabrication stage, gates 68, 69 for the FinFET 72 (FIGS. 14A,B) are formed by depositing a gate conductor to fill each gate trench 58 and then planarizing the deposited gate conductor to re-establish the substantial planarity of planar surface 26 using a conventional planarization process, such as CMP, that stops on pad nitride layer 14. Such processes are recognized, as understood by persons of ordinary skill in the art, as damascene processes. The conductor of gates 68, 69 may comprise a refractory metal like tungsten, doped or undoped polysilicon, a metal silicide like nickel silicide or tungsten silicide, or any combination of these materials. The conductor selected for the gates 68, 69 establishes the work function and, consequently, influences the threshold voltage ($V_t$) of the completed FinFET 72. The gates 68, 69 are separated from each other by the material of the insulating cap 28 and the material of the semiconductor fin 30. As a consequence, gates 68, 69 are not electrically connected in this split-gate arrangement in which each of the gates 68, 69 may be independently biased to control the operation of the FinFet 72.

Figure 13A:
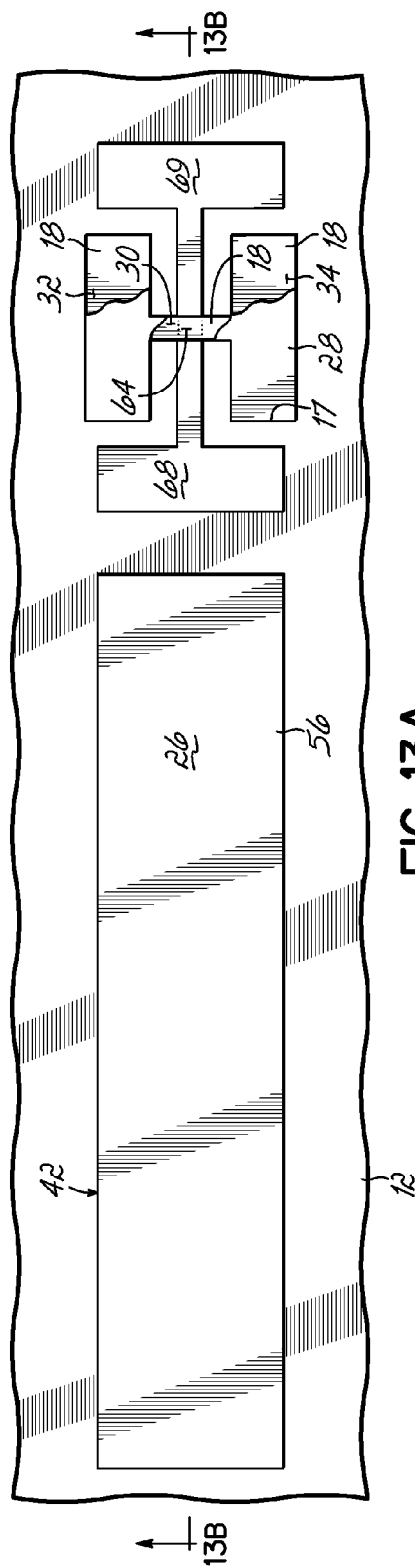
Figure 13B:
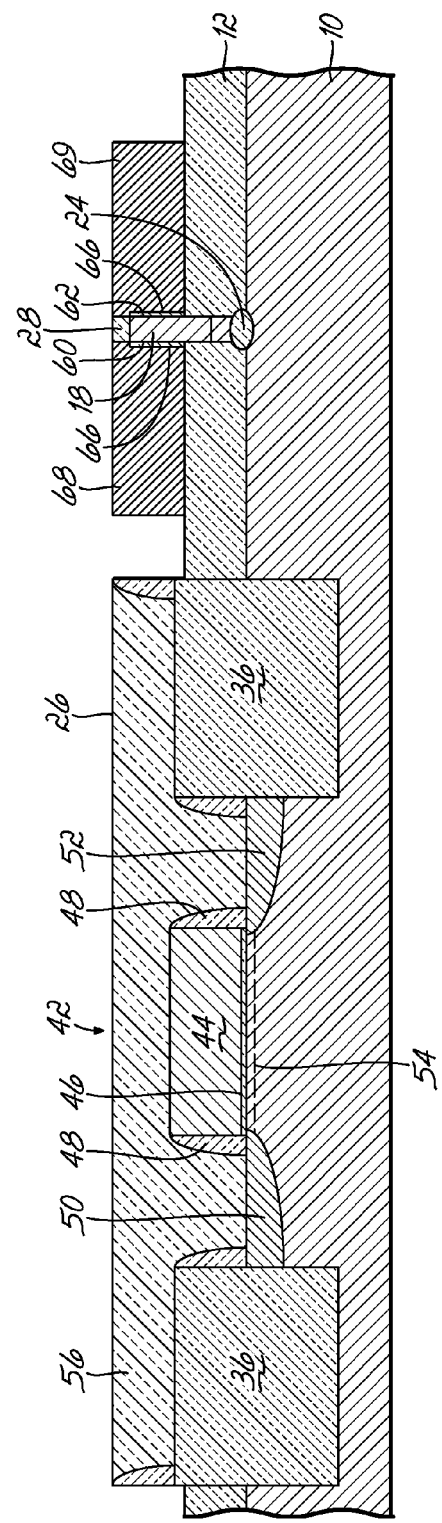

With reference to FIGS. 13A,B in which like reference numerals refer to like features in FIGS. 12A,B and at a subsequent fabrication stage, the remainder of the pad nitride layer 14 is stripped by an etch process that removes the material of the pad nitride layer 14 selective to the materials constituting the oxide layer 12 and gates 68, 69. For example, a wet isotropic etch process using hot acid, such as phosphoric acid, may be employed to remove $Si_3N_4$ relative to oxide and most of the gate materials. However, for compatibility with other materials that may be used for the conductor of gate 68, other isotropic $Si_3N_4$ etchant processes may also be used, including dry etch processes such as a single step process using an etchant with a $N_2/Ar/CHF_3$ chemistry or a multi-step etch process that uses an etch chemistry with a gas mixture of $CHF_3+SF_6+He$ followed by a $SF_6+HBr+He$ gaseous etch chemistry and concludes with an etch chemistry having a $SF_6+O_2+He$ gas mixture.

After removal of pad nitride layer 14, any residual film may be isotropically etched from the sidewalls of source and drain regions 32, 34 and source-drain doping introduced by a well known method, such as gas phase doping or ion implantation. The oxide cap 28 and the gate conductors 68, 69 protect the channel of the FinFET 72 (FIGS. 14A,B) from being contaminated by the source-drain doping. Any channel doping introduced earlier into the source-drain regions 32, 34, by the optional channel doping process, is effectively covered up by the much higher concentration source-drain doping. Doping of the source-drain regions 32, 34 typically would entail the use of multiple masks, such as photoresist masks, to introduce different dopants to form N-channel FinFET's and P-channel FinFET's.

With reference to FIGS. 14A,B in which like reference numerals refer to like features in FIGS. 13A,B and at a subsequent fabrication stage, optional spacers 70 of, for example, $Si_3N_4$, may be formed on the vertical sidewalls of the gates 68, 69 defining a gate structure of the FinFET 72. The spacers 70 operate to encapsulate the source-drain diffusions used to dope the source and drain regions 32, 34 for completing the fabrication of the FinFET 72. The spacers 70 may be formed by a conformal deposition of a CVD nitride layer and directional removal by, for example, an RIE process. An insulating filler 74, such as a reflowable glass like BPSG, is deposited and planarized by a conventional planarization process such as CMP to fill all remaining gaps. The resultant semiconductor structure is in a condition suitable for conventional processing, which includes formation of contact vias and studs, multilayer patterned metallization, and interlevel dielectrics, to complete the integrated circuit.

The present invention provides a process for integrating planar devices 42, such as CMOSFET's, and FinFET's 72 on a common bulk substrate 10, as well as on an SOI substrate (not shown). The semiconductor fin 30 of the FinFET 72 includes the self-aligned isolation region 24 that isolates fin 30 electrically from the substrate 10 provided by implanting a species suitable to form isolation region 24. The fin 30 of the FinFET 72 is formed by a two-step process that provides control over the profile of the self-aligned isolation region 24 formed by ion implantation and annealing.

Significantly improved mechanical integrity is provided during fabrication, which significantly reduces fin breakage by supporting the semiconductor fin 30 during processing such that the fin 30 is not free standing and self-supporting, as is conventional. Regardless of the specific fabrication stage, the fin 30 of each FinFET 72 is either totally or near totally supported by at least the adjacent pad nitride layer 14. This protects the thin fragile fin 30 and, thereby, avoids breakage problems experienced during traditional fabrication methods. The FinFET's 72 are capable of split-gate operation, where the voltage applied to each of the gates 68, 69 is independently controllable.

The non-planar device architecture or structure of the FinFET 72 includes the central vertical semiconductor fin 30 that projects away from the plane of substrate 10. The fin 30 of each FinFET 72 includes a central channel region 64, source and drain regions 32, 34 that are separated by the central channel regions, and gates 68, 69 that intersect the channel region 64 of the semiconductor fin 64. The semiconductor fin 30 may have a width that is less than the minimum lithographic dimension and a relatively high aspect ratio of height to width. Each planar device 42 has a single horizontal body section including source and drain regions 50, 52 and channel 54 that is controlled by the overlying gate electrode 44. With the exception of the gate electrode 44, most components of the planar device 42, including the source and drain regions 50, 52 and channel 54, are built in the plane of the surface 15 of substrate 10.

FIGS. 15-20 illustrate the fabrication stages involved in practicing an alternative embodiment of the present invention. In these drawings, the views labeled with "A" are top views of the semiconductor structure at one of the fabrication stages, while the views labeled with "B" are cross-sectional views of the semiconductor structure.

Figure 15A:
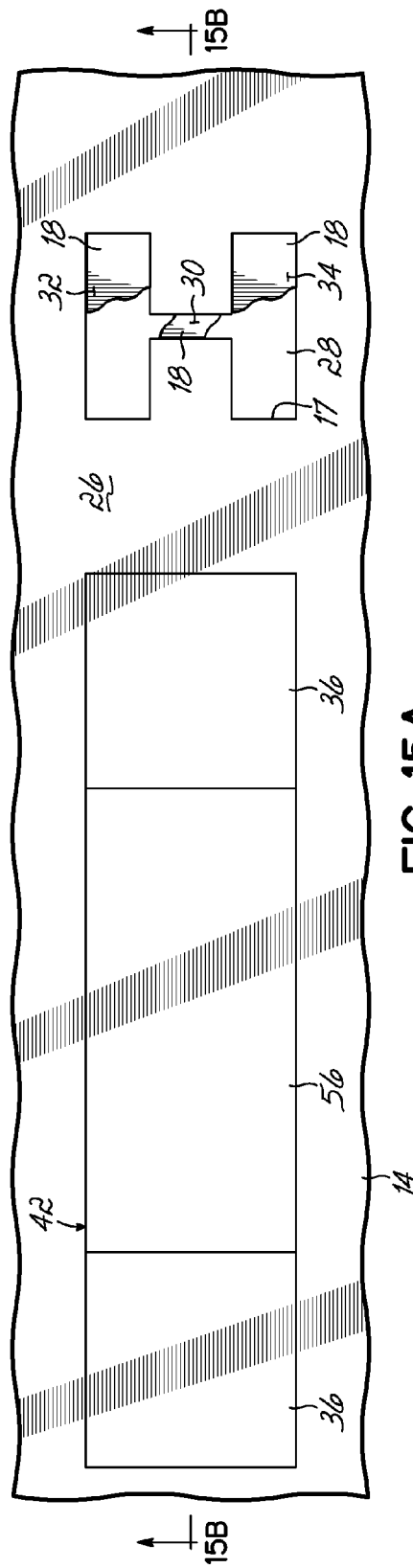
Figure 15B:
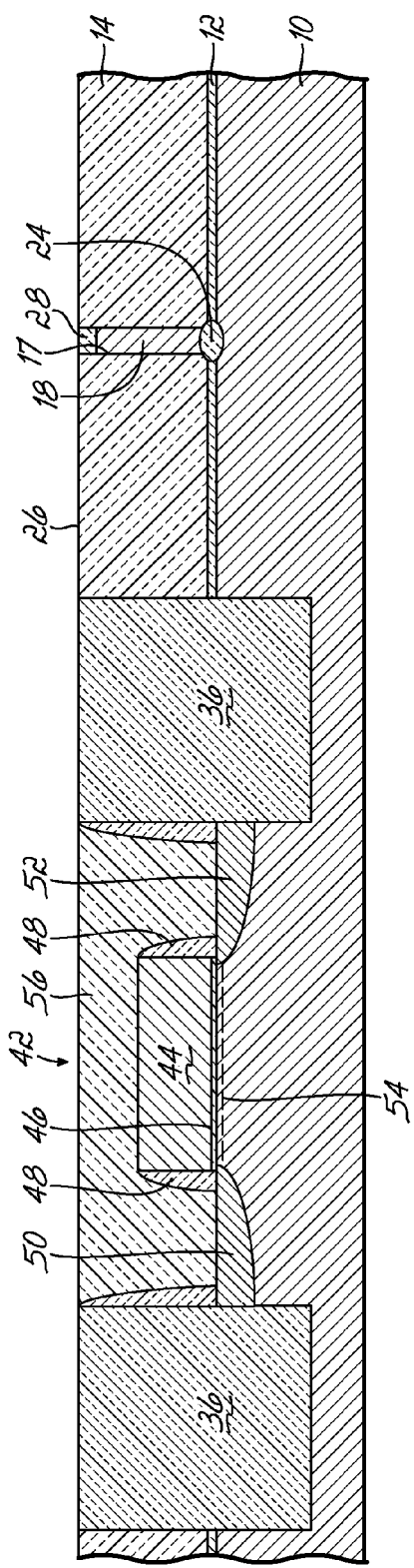

In accordance with the alternative embodiment of the present invention and with reference to FIGS. 15A,B, processing proceeds as described above with regard to FIGS. 1A,B through FIGS. 9A,B to provide the depicted intermediate structure shown in FIGS. 15A,B. However, the pad oxide layer 12 in this embodiment of the present invention has a comparatively reduced vertical thickness that is preferably about 1 nm to about 10 nm. The relatively thin pad oxide layer 12 serves as a stress relief layer and adhesion promoter for a subsequently formed pad nitride layer 14. In this embodiment of the present invention, the pad oxide layer 12 is too thin to form the isolation for the semiconductor fin 30, as does the thicker pad oxide layer 12 shown in FIGS. 1A,B. The pad nitride layer 14 has a thickness of 50 nm to about 500 nm and ultimately determines the height of the semiconductor fin 30.

Figure 16A:
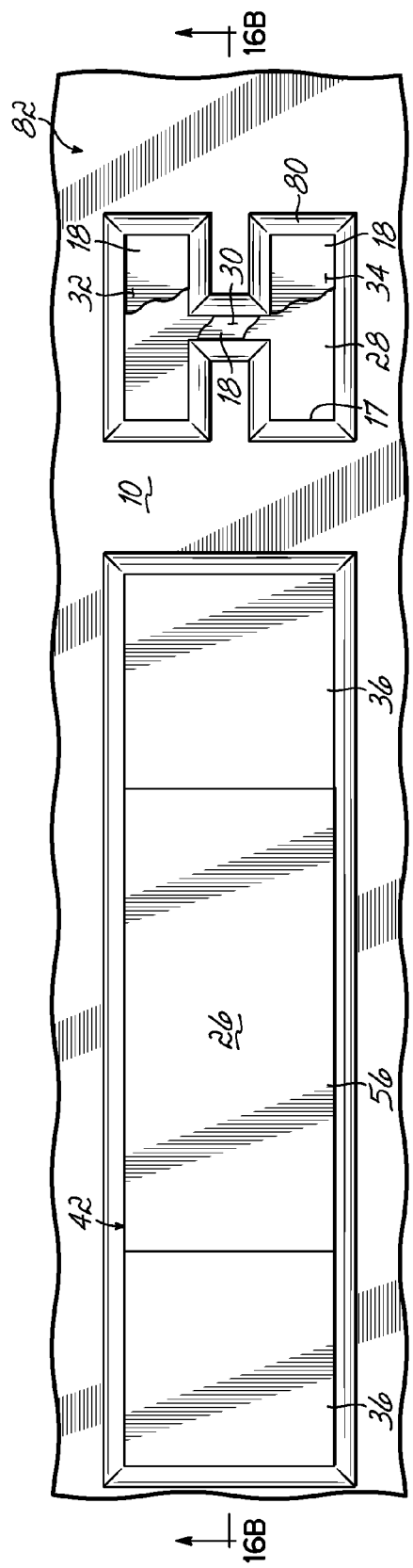
Figure 16B:
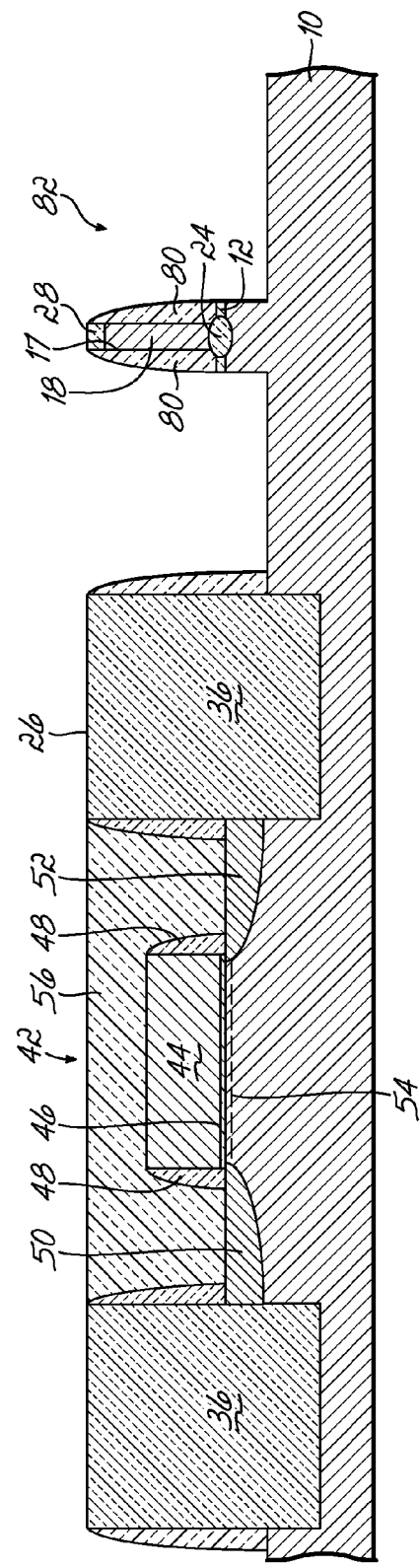

With reference to FIGS. 16A,B in which like reference numerals refer to like features in FIGS. 15A,B and at a subsequent fabrication stage, the pad nitride layer 14 is removed selectively to the material forming pad oxide layer 12 and the material forming the substrate 10. If the pad nitride layer 14 is $Si_3N_4$, the pad oxide layer 12 is $SiO_x$, and the substrate 10 is silicon, the pad nitride layer 14 may be removed with a wet etch in an acid etchant like a phosphoric acid solution or a dry etch process with a $CF_3$ chemistry. Removal of the pad nitride layer 14 exposes the semiconductor fin 30.

A sacrificial sidewall spacer 80 is formed on the vertical sidewall extending about the semiconductor fin 30 and the source and drain regions 32, 34. For example, sidewall spacer 80 may be formed by depositing a layer of CVD nitride with a thickness of 5 nm to 15 nm and performing an appropriate RIE process to form the sidewall spacer 80. The process forming sidewall spacer 80 may form extraneous spacers on the vertical sidewall of the STI regions 36.

A recess 82 is defined in the substrate 10 by an appropriate process, such as a RIE process, that recesses the unprotected portions of the substrate 10. The vertical depth of the recess 82 is preferably between about 20 nm and about 200 nm beneath the unetched surface 26. A portion of the recess 82 surrounds each semiconductor fin 30, and also extends about the source and drain regions 32, 34. During etching, the sidewall spacer 80 and protective insulating cap 28 mask the semiconductor fin 30 and regions of substrate 10 vertically beneath the sidewall spacer 80. As a result, the recess 82 is self-aligned to the fin 30.

Figure 17A:
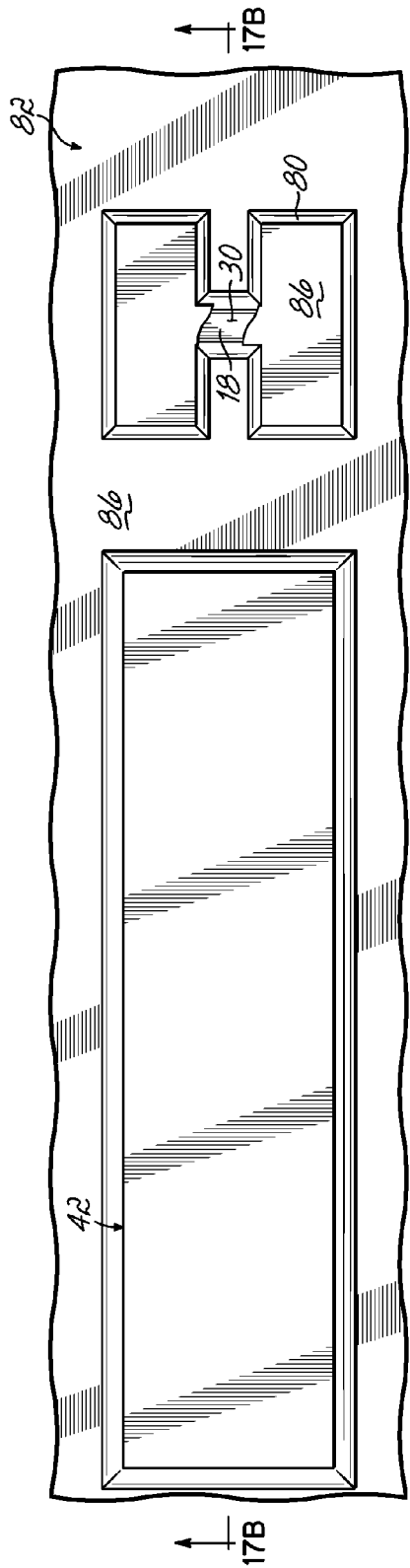
Figure 17B:
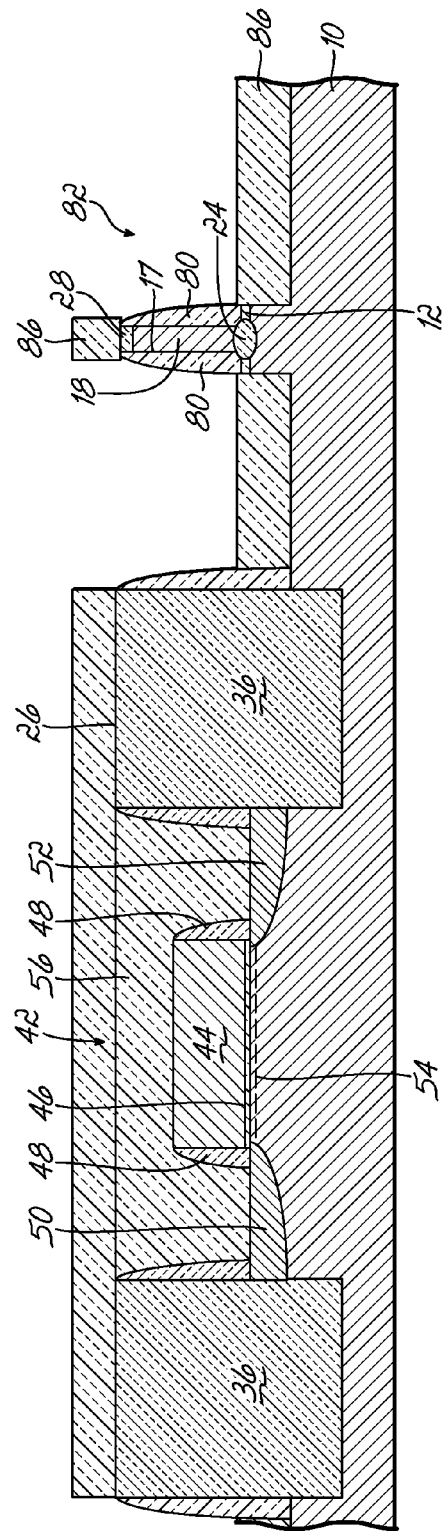

With reference to FIGS. 17A,B in which like reference numerals refer to like features in FIGS. 16A,B and at a subsequent fabrication stage, a layer 86 of a dielectric, such as an HDP oxide, is deposited with a thickness that fills the recess 82 to a level vertically above the horizontal level of the pad oxide layer 12. The material of the dielectric layer 86 deposits primarily on the horizontal surfaces. Any extraneous dielectric material from layer 86 is removed from the vertical sidewalls 98, 100 (FIGS. 18A,B) of the semiconductor fin 30 and the sidewalls of the source and drain regions 32, 34, and any other vertical sidewalls such as STI regions 36. For example, an isotropic oxide etch may remove these extraneous portions of dielectric layer 86. The dielectric layer 86 is self-aligned to the semiconductor fin 30 because of the fabrication steps forming the isolation recess 82. A portion of the dielectric layer 86 also overlies each fin 30.

Preferably, the dielectric layer 86 is formed by a concurrent dielectric layer deposition and etching process that provides a thickness ratio of the constituent dielectric on the horizontal surfaces to vertical surfaces of at least about 10:1. For example, dielectric layer 86 may be constituted by a HDP oxide formed by a plasma CVD process that employs a gas mixture containing oxygen, silane, and inert gases, such as argon, to achieve simultaneous dielectric etching and deposition. The inert gas tends to remove oxide depositing on vertical surfaces by sputtering.

Figure 18A:
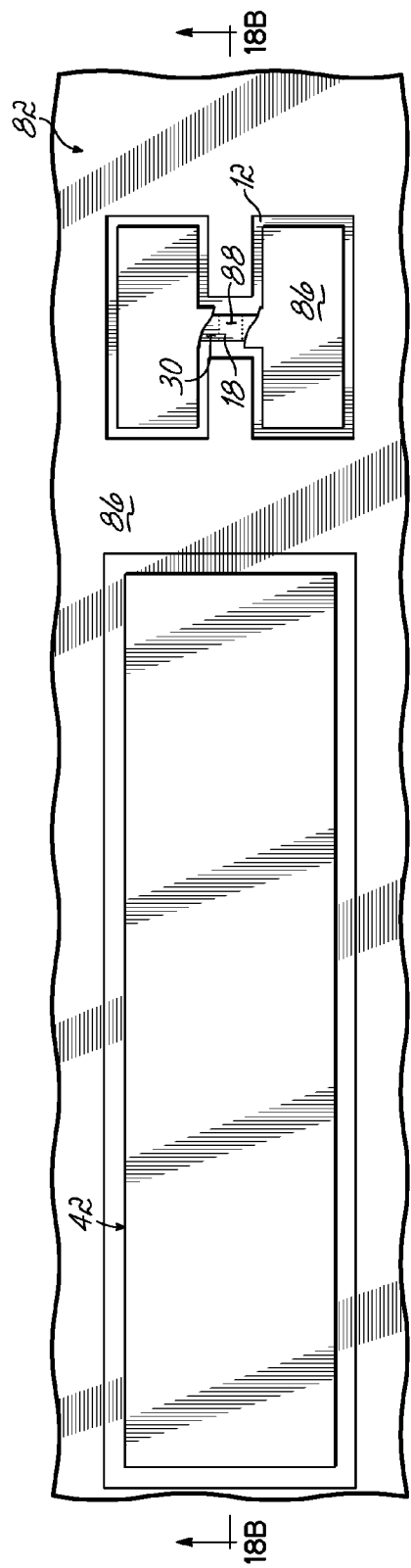
Figure 18B:
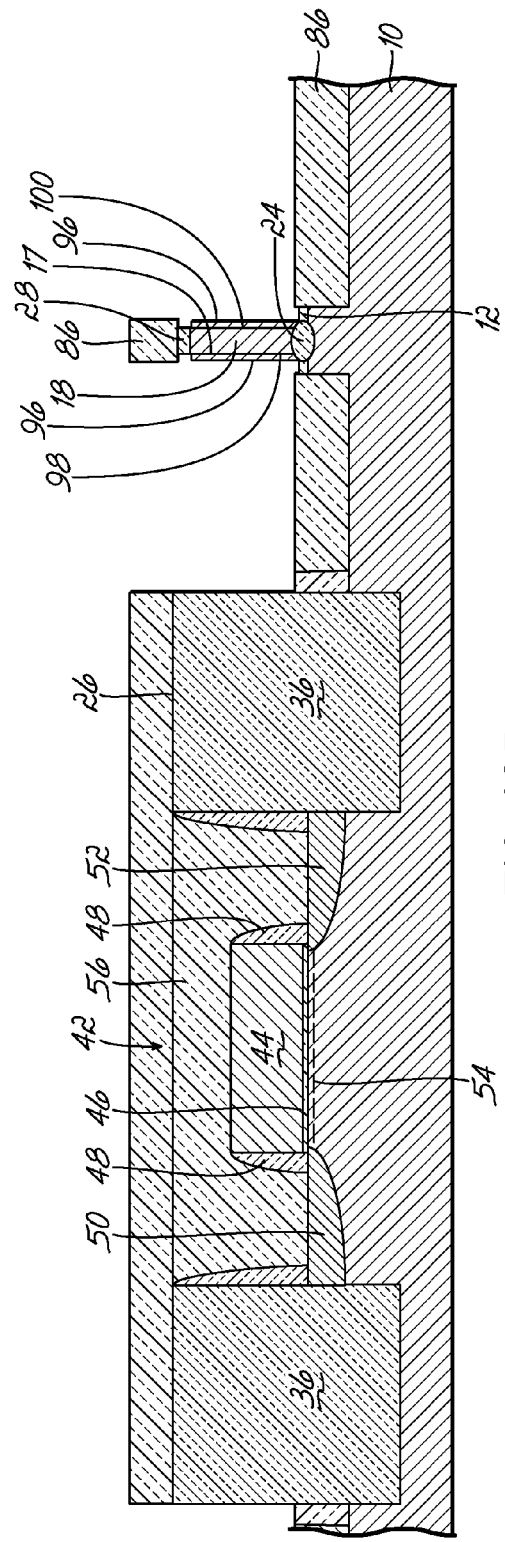
Figure 20A:
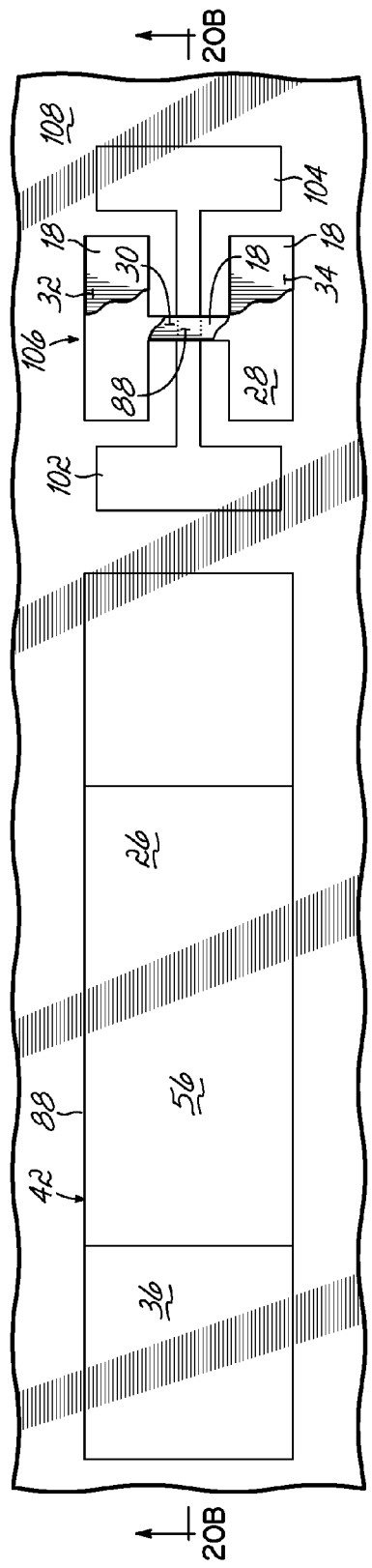
Figure 20B:
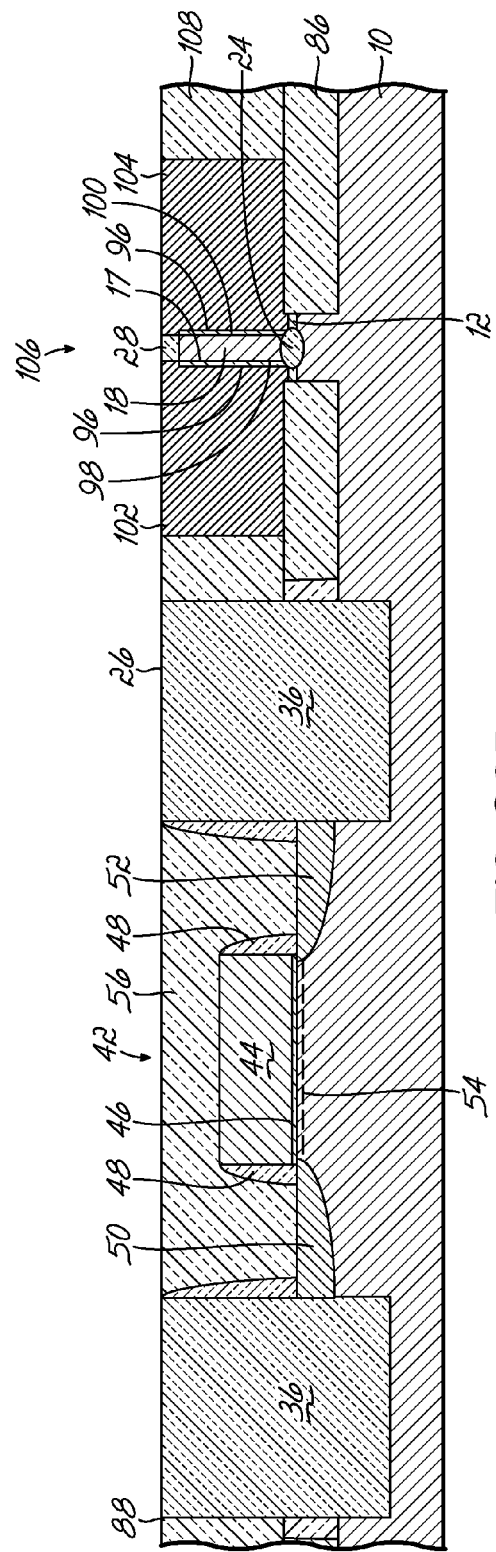

With reference to FIGS. 18A,B in which like reference numerals refer to like features in FIGS. 17A,B and at a subsequent fabrication stage, the sidewall spacer 80 (FIGS. 17A, B) is removed selectively to the material forming the substrate 10 and the dielectric layer 86. After the sidewall spacer 80 is removed, a channel region 88 of fin 30 may be optionally doped by, for example, a gas phase dopant diffusion process or an angled ion implantation. The optional channel doping of the channel region 88 typically would entail the use of multiple masks (not shown), such as photoresist masks, to introduce different dopants in various levels to form N-channel FinFET's and P-channel FinFET's of various threshold voltages. If the thickness of the semiconductor fin 30 in the channel region 88 is sufficiently narrow, channel doping may be omitted as the intrinsic semiconductor material in channel region is fully-depleted during operation of the FinFET 106 (FIGS. 20A,B). Although the source-drain regions 32, 34 are exposed during the optional channel doping process, the much higher concentration doping subsequently introduced into source-drain 32, 34 will dominate over the relatively low dopant concentration introduced into the channel region 88.

With reference to FIGS. 19A,B in which like reference numerals refer to like features in FIGS. 18A,B and at a subsequent fabrication stage, a gate dielectric 96 is formed on the exposed opposite sidewalls 100, 102 of the channel region 88 of each semiconductor fin 30. The gate dielectric 96 may consist of any conventional gate insulator material including, but not limited to, $SiO_x$, $SiO_xN_y$, $Si_3N_4$, high-K dielectrics such as silicon-hafnium-oxynitride, or combinations thereof, as recognized by persons of ordinary skill in the art. The thickness of the gate dielectric 96 is preferably in a range from about 1 nm to about 6 nm.

Gates 102, 104 for each FinFET 106 are defined by filling portions of recess 82 overlying the dielectric layer 86 with a deposited layer of a suitable gate conductor material and planarizing by a conventional planarization process, such as CMP, to the planar surface 26 established at the horizontal level of planar MOSFET region 42. Such processes are known, as understood by persons of ordinary skill in the art, as damascene processes. The gate conductor material may comprise a refractory metal like tungsten, doped or undoped polysilicon, a metal silicide like nickel silicide or tungsten silicide, or any combination of these materials. The type of gate conductor material establishes the work function and, consequently, influences the threshold voltage ($V_t$) of the completed FinFET 106. The gate conductor material is then patterned, selective to oxide cap 28 and the planar MOSFET region 42, by a conventional lithography and etching processes to define gates 102, 104. The gates 102, 104 on each side of the semiconductor fin 30 are separated from each other by the material of the insulating cap 28 and the material of semiconductor fin 30. As a consequence, the opposing gates 102, 104 are not electrically connected in this split-gate arrangement in which each of the gates 102, 104 may be independently biased to control the operation of the FinFET 106.

Source-drain doping is now introduced into the exposed sidewalls of source-drain regions 32, 34 by well known methods such as gas phase doping or ion implantation. The oxide cap 28 and the gates 102, 104 protect the channel region 88 of the FinFET 106 from being contaminated by the source-drain doping. Any channel doping introduced earlier into the source-drain regions 32, 34, by the optional channel doping process, is effectively covered up by the much higher concentration source-drain doping. Doping of the source-drain regions typically would entail the use of multiple masks, such as photoresist masks, to introduce different dopants to form N-channel FinFET's and P-channel FinFET's.

With reference to FIGS. 20A,B in which like reference numerals refer to like features in FIGS. 19A,B and at a subsequent fabrication stage, a layer 108 of an insulator, which is preferably a soft reflowable and easily planarizable oxide like BPSG, BSG, PSG, or undensified TEOS, is deposited and planarized by a conventional planarization process, such as CMP, to re-establish the planar surface 26 coinciding with the upper horizontal surfaces of oxide cap 28 and planar semiconductor device 42. The residual insulator layer 108 fills the interstitial space surrounding the planar semiconductor device 42 and FinFET 106. The completed semiconductor structure consisting of planar semiconductor device 42 and FinFET 106, and many replicas of this combined structure reproduced across the surface of substrate 10, is ready for conventional processing, which may include formation of contact vias and studs, multilayer patterned metallization, and interlevel dielectrics.

The channel width of FinFET 106 is proportional to the height of fin 30 because, in FinFET devices, the channel width is vertical. Therefore, the channel width is approximately equal to the height of fin 30 covered by the gate dielectric 96 and, thus, separated from gates 102, 104. Because of the fabrication technique used to form the dielectric layer 86, the channel width for FinFET 106 is greater than the channel width for FinFET 72 (FIGS. 14A,B), which may be beneficial for certain applications of the semiconductor structure.

References herein to terms such as "vertical", "horizontal", etc. are made by way of example, and not by way of limitation, to establish a frame of reference. The term "horizontal" as used herein is defined as a plane parallel to the conventional plane or surface 15 of substrate 10, regardless of the actual spatial orientation of substrate 10. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of making a semiconductor structure, the method comprising:

etching a trench in a mask covering a substrate;

forming a first epitaxial layer in the trench;

implanting ions into the first epitaxial layer through the mask such that the trench self-aligns the implanted ions with the first epitaxial layer;

transforming the implanted ions into a buried isolation region electrically isolating the first epitaxial layer from the substrate; and forming a second epitaxial layer in the trench and on the first epitaxial layer.

2. The method of claim 1 wherein the first epitaxial layer and the substrate include silicon, and the buried isolation region includes oxygen and silicon, and implanting ions into the first epitaxial layer further comprises:

implanting oxygen-containing ions into the epitaxial layer.

3. The method of claim 1 wherein an interface is defined between the epitaxial layer and the substrate, and implanting ions into the first epitaxial layer further comprises:

selecting an ion energy such that an ion range is near the interface.

4. The method of claim 1 wherein the substrate is moncrystalline and the trench extends to the substrate, and forming the first epitaxial layer further comprises:

using the substrate as a seed for forming the first epitaxial layer.

5. The method of claim 1 wherein forming the second epitaxial layer further comprises:

using the first epitaxial layer as a seed for forming the second epitaxial layer.

6. The method of claim 1 wherein the implanted ions are transformed by a thermal treatment into the buried isolation region.

7. The method of claim 1 wherein the thermal heat treatment anneals damage in the first epitaxial layer resulting from the ion implantation, and further comprising:

using the first epitaxial layer as a seed for forming the second epitaxial layer.

8. A method of making a semiconductor structure, the method comprising:

forming a semiconductor fin projecting from a substrate;

etching portions of the substrate surrounding the semiconductor fin to define a recess in the substrate about a base of the semiconductor fin; and at least partially filling the recess with a dielectric material to electrically isolate the semiconductor fin from the substrate, wherein the semiconductor fin is formed by a damascene process, and a patterned mask used to form the semiconductor fin is removed before etching portions of the substrate surrounding the semiconductor fin.

9. The method of claim 8 further comprising:

forming a sidewall spacer on at least one sidewall of the semiconductor fin before etching portions of the substrate surrounding the semiconductor fin.

10. The method of claim 9 further comprising:

removing the sidewall spacer from the semiconductor fin after etching portions of the substrate surrounding the semiconductor fin.

11. The method of claim 8 further comprising:

forming a protective cap on the semiconductor fin before etching portions of the substrate surrounding the semiconductor fin.

12. The method of claim 8 wherein an insulating layer separates the semiconductor fin from the substrate, and the dielectric material fills the recess to a height above the insulating layer.

13. The method of claim 8 wherein the semiconductor fin includes a channel region, and further comprising:

doping the channel region; and forming a gate dielectric on the first and second sidewalls of the semiconductor fin before filling the regions adjacent the fin with a conductor.

14. The method of claim 13 further comprising:

patterning and etching the conductor to form a first gate adjacent a first sidewall of the channel region; and forming a second gate adjacent a second sidewall of the channel region, the first gate being electrically isolated from the second gate.

* * * * *